(12) United States Patent
Yamashita et al.

(10) Patent No.: US 8,150,657 B2
(45) Date of Patent: Apr. 3, 2012

(54) PHYSICAL QUANTITY MEASURING INSTRUMENT AND SIGNAL PROCESSING METHOD THEREOF

(75) Inventors: Masaya Yamashita, Tokyo (JP); Toru Kitamura, Tokyo (JP); Munehiro Kitaura, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 520 days.

(21) Appl. No.: 12/440,831

(22) PCT Filed: Sep. 12, 2007

(86) PCT No.: PCT/JP2007/067743
§ 371 (c)(1),
(2), (4) Date: Mar. 11, 2009

(87) PCT Pub. No.: WO2008/032741
PCT Pub. Date: Mar. 20, 2008

(65) Prior Publication Data
US 2009/0271142 A1  Oct. 29, 2009

(30) Foreign Application Priority Data

Sep. 12, 2006 (JP) ................................. 2006-247230
Feb. 19, 2007 (JP) ................................. 2007-037850

(51) Int. Cl.
*G06F 19/00* (2006.01)
*G06F 17/40* (2006.01)
(52) U.S. Cl. ........ 702/189; 73/865.8; 702/187; 708/200
(58) Field of Classification Search ................ 73/432.1, 73/865.8, 865.9; 324/200, 244, 247, 260; 702/1, 2, 127, 150, 187, 189, 190, 191, 194; 708/100, 200, 300, 303
See application file for complete search history.

(56) References Cited

U.S. PATENT DOCUMENTS

| | | | |
|---|---|---|---|
| 6,278,271 B1 | 8/2001 | Schott et al. | |
| 6,788,221 B1 * | 9/2004 | Ely et al. | 341/20 |
| 6,980,134 B2 * | 12/2005 | Ely et al. | 341/20 |
| 2003/0020642 A1 * | 1/2003 | Ely et al. | 341/111 |
| 2005/0119865 A1 * | 6/2005 | Bartsch | 702/188 |

FOREIGN PATENT DOCUMENTS

| | | |
|---|---|---|
| JP | 07-151842 | 6/1995 |
| JP | 08-210855 | 8/1996 |
| JP | 2001-004408 | 1/2001 |
| JP | 2002-071381 | 3/2002 |
| JP | 2005-065789 | 3/2005 |
| JP | 2005-283503 | 10/2005 |

* cited by examiner

*Primary Examiner* — Edward Cosimano
(74) *Attorney, Agent, or Firm* — Morgan, Lewis & Bockius LLP

(57) ABSTRACT

The present invention relates to a physical quantity measuring instrument and signal processing method thereof capable of reducing noise components and improving reliability without increasing size or cost of the circuit. A physical quantity detecting unit (11) has signal detecting components for detecting a plurality of signals based on a desired physical quantity and detects the desired physical quantity. A signal processing unit (12) executes signal processing of the signals detected on the individual detecting axes by the physical quantity detecting unit (11) for linearly combining the signals in different combinations with time. An arithmetic processing unit (13) combines and calculates a plurality of signals based on the physical quantity associated with the physical quantity detecting unit (11) from the signal data output by the signal processing unit (12). It can linearly combine the signals from the plurality of detecting axes in different combinations with time, output them, and obtain desired signal components whose noise components are reduced by calculating the outputs.

34 Claims, 20 Drawing Sheets

SENSOR ELEMENT

DIRECTION OF MAGNETIC
FIELD SENSOR ELEMENT DETECTS

PHYSICAL QUANTITY MEASURING INSTRUMENT AND SIGNAL PROCESSING METHOD THEREOF

TECHNICAL FIELD

The present invention relates to a physical quantity measuring instrument and a signal processing method thereof, and more particularly to a physical quantity measuring instrument and a signal processing method thereof relating to noise reduction in physical quantity measurement with a plurality of sensor elements.

BACKGROUND ART

In recent years, there has been an increasing trend for portable equipment to incorporate a multiaxial physical quantity measuring instrument such as a three-axis acceleration sensor or three-axis magnetic sensor.

FIG. 1 is a block diagram showing a schematic configuration of a three-axis acceleration sensor as a conventional physical quantity measuring instrument, which block diagram corresponds to FIG. 5 shown in Patent Document 1. Three acceleration sensor elements 101, 102 and 103 detect a three-dimensional acceleration vector, and signals Hx, Hy and Hz corresponding to the X-axis component, Y-axis component and Z-axis component of the acceleration are output.

One of the output signals Hx, Hy and Hz is selected by a signal selecting unit 104, and the selected signal is amplified successively by an operational amplifier 105. To the output signal in this case, a noise component N is added. Here, the reference numeral 108 schematically designates the noise component added to the signal.

Thus, the output signal Hx+N, Hy+N or Hz+N is obtained successively. The signal amplified by the operational amplifier 105 is converted to digital data by an A/D converter 106 so that acceleration data corresponding to the X-axis, Y-axis and Z-axis are obtained.

FIG. 2 is a diagram showing the output signal of the A/D converter when the signal selecting unit shown in FIG. 1 makes a selection, and showing the timing of the data acquired when the three-axis acceleration sensor obtains the three-dimensional acceleration data continuously. The upper row shows the signal selected by the signal selecting unit, and the lower row shows the output signal of the A/D converter including the noise component.

The configuration shown in FIG. 1 can provide only a single-axis acceleration data at a time. Accordingly, to acquire the three-dimensional acceleration data continuously, the signal selecting unit must change the signal to be selected with time.

Since the method of successively acquiring the signals as shown in FIG. 2 can use the circuit after the sensor elements such as the operational amplifier 105 and A/D converter 106 in common, it has an advantage of being able to reduce the size of the circuit. Furthermore, if necessary, it can obtain any desired information about acceleration by calculating the signal converted through the A/D converter 106 by the arithmetic processing unit 107.

As a concrete example of the arithmetic processing, there is one that calculates the inclination of the three-axis acceleration sensor with respect to a horizontal plane. Consider the case where the X-axis sensor element 101, Y-axis sensor element 102 and Z-axis sensor element 103 are disposed in the three-axis acceleration sensor as shown in FIG. 3.

The sensor elements 101, 102 and 103 disposed on the individual axes detect gravitational acceleration, and the arithmetic processing unit 107 can obtain the roll angle $\psi$, the angle which the X-axis forms with horizontal plane, and the pitch angle $\theta$, the angle which the Y-axis forms with the horizontal plane, by the following calculation.

$$\psi = \tan^{-1} \frac{H_X}{H_Z}$$
$$\theta = \tan^{-1} \frac{H_Y}{H_Z}$$
[Expression 1]

As an example of a two-axis or three-axis magnetic sensor, there is one described in Patent Document 2, for example. The Patent Document 2 discloses a three-axis magnetic sensor which places a plurality of Hall elements on edge of a magnetic concentrator, and detects not only the magnetic field in the direction parallel to the magnetic concentrator, but also the magnetic field perpendicular to that direction simultaneously.

FIG. 4 is a block diagram showing a schematic configuration of the magnetic sensor in the Patent Document 2. Assume that the X-axis component of the magnetic field is Hx, the Y-axis component is Hy, and the Z-axis component is Hz. Then the sensor element (A) 201 to sensor element (D) 204 output the following signals, respectively.

201: $H_x+H_z+n=A$

202: $-H_x+H_z+n=B$

203: $H_y+H_z+n=C$

204: $-H_y+H_z+n=D$ [Expression 2]

where n represents a noise component due to the sensor elements.

Since the signals are a mixture of the signal based on the X-axis component and the signal based on the Z-axis component, or a mixture of the signal based on the Y-axis component and the signal based on the Z-axis component, the signal selecting unit 205 selects one of the following combinations so that each component is output separately (the pairs of wires drawn by the same line types in the signal selecting unit 205 shown in FIG. 4 are selected successively).

A−B

C−D

A+B

Although the signals are successively input to the operational amplifier 206 to be amplified, the output signals in this case include an additional noise component N due to the operational amplifier 206. The output of the operational amplifier 206 becomes as follows.

$(\alpha)=2(H_x+n/\sqrt{2}+N/2)$ $(\beta)=2(H_y+n/\sqrt{2}+N/2)$ $(\gamma)=2(H_z+n/\sqrt{2}+N/2)$ [Expression 3]

An A/D converter 207 converts the signal output by the operational amplifier 206 to digital data to obtain magnetic field data corresponding to the X-axis, Y-axis and Z-axis.

FIG. 5 is a schematic diagram of the output signal of the A/D converter when the signal selecting unit shown in FIG. 4 makes a selection, and shows timing of the data obtained when the magnetic sensor acquires the three-dimensional magnetic data continuously. The upper row shows the signals selected by the signal selecting unit, and the lower row shows the output signal of the A/D converter into which the noise components are mixed.

If necessary, the arithmetic processing unit 208 can obtain any desired information about the magnetic field by calculating the signals converted by the A/D converter 207.

Thus, as for sensors incorporated into the portable equipment such as the foregoing acceleration sensor and magnetic sensor, there has been an increasing demand for miniaturization as a demand increases for making the portable equipment more multifunctional and smaller. However, as the demand for miniaturization increases on the one hand, the miniaturization of the sensor generally presents a problem of increasing the noise component against the signal on the other. In addition, the portable equipment is susceptible to noise from the other elements because its inside is very highly integrated. These factors together offer an issue of noise reduction of the sensor.

Concerning the noise reduction of the sensor, the Patent Document 2 discloses a method of improving the S/N (signal/noise) ratio using the magnetic concentrator. As for the magnetic field in the direction parallel to the magnetic concentrator, since the magnetic concentrator amplifies its magnetic flux density, the magnetic sensitivity increases, and the S/N ratio improves. In particular, to detect a very week magnetic field such as geomagnetism (30 µT), the improvement of the S/N ratio becomes an important factor. However, when the magnetic concentrator has a much longer length with respect to its height, there is little effect of amplifying the magnetic flux density as to the magnetic field in the perpendicular direction. Accordingly, the magnetic detection sensitivity in the perpendicular direction does not improve, which presents an inevitable problem in that the S/N ratio is worse than that in the direction parallel to the magnetic concentrator. For this reason, a method is used for preventing the imbalance between the S/N ratios in the parallel and perpendicular directions to the magnetic concentrator by suppressing to some extent the improvement in the magnetic sensitivity obtained by using the magnetic concentrator.

In addition, it is not easy to dispose the sensors in an IC in such a manner as to enable detection of the components in the three-axis directions. Generally, when the Hall elements are disposed in the IC, they are placed in parallel with the IC. Since the Hall elements detect the magnetism perpendicular to the magneto-sensitive plane, it is easy for them to detect the magnetism in the perpendicular direction. To detect the magnetism parallel to the IC, however, it is necessary to dispose the elements in the perpendicular direction in the IC, which is not easy. In addition, another problem arises in that the IC becomes higher by the amount of placing the elements perpendicularly to the IC.

For this reason, a method is sometimes used which disposes the sensor elements on the skew, in which case the detection sensitivity is reduced in some axis directions. Accordingly, a method is used which improves the magnetic detection sensitivity in the perpendicular direction by increasing the number of the sensor elements. However, the method presents a new problem of increasing the size of the magnetic sensor.

Patent Document 3 shows a magnetic sensor including first and second magnetic detecting units capable of outputting first and second detection signals with their phases shifted by 90 degrees; a signal processing circuit for digitizing and amplifying the first and second detection signals; and a power supply circuit for intermittently supplying power to the first and second magnetic detecting units and the signal processing circuit. In addition, it includes a noise processing circuit for reducing noise components contained in the first detection signal digitized and output by the signal processing circuit. The Document 3 describes that the noise processing circuit reduces the noise components contained before and after the switching points of the logic levels of the first detection signal in accordance with the logic levels of the digitized first and second detection signals.

Patent Document 4 describes a method of eliminating offsets of Hall elements and their output amplifiers using a chopper. Here in the physical quantity measuring instrument, the offsets, which are caused by the sensor elements or a circuit following the sensor elements, are mentioned as one of the causes of the S/N ratio reduction just as the noise.

Patent Document 5 describes a three-axis magnetic sensor which has a configuration that places a plurality of electrodes on a single Hall element and outputs from the individual electrodes mixtures of the magnetic components in the horizontal direction and perpendicular direction in the same manner as the Patent Document 2; and which detects the magnetic components in the three-dimensional directions simultaneously by adding and subtracting the outputs from the electrodes by operational amplifiers.

However, the foregoing Patent Documents have a problem in that since they detect the physical quantity to be measured for each component individually, the timing of measurement for each component varies from component to component. In addition, the noise reduction method of the foregoing Patent Document 3 is, just like a similar fashion as other noise reduction methods, applied to the physical quantity to be measured or a measuring device dedicatedly. It means, when the physical quantity to be measured or the configuration of a device is changed, the noise reduction method applied to the foregoing Patent Document 3 cannot achieve sufficient effect often.

On the other hand, as for the configuration of the Patent Document 5, since it detects the three-dimensional magnetic components simultaneously, the timing of the measurement is not shifted. However, it has a problem of increasing the circuit scale and current consumption.

In addition, although it has an advantage of general-purpose noise component reduction to use elements or semiconductor components that are resistant to generating noise components, the elements or components are usually expensive and large, thereby making it difficult to reduce the cost and size.

The present invention is implemented to solve the foregoing problems. Therefore it is an object of the present invention to provide a physical quantity measuring instrument and a signal processing method thereof capable of improving the timing difference in the measurement between the individual components corresponding to the axes. Another object is to provide a physical quantity measuring instrument and a signal processing method thereof capable of reducing the noise components and improving reliability without increasing the circuit scale or cost.

Patent Document 1: Japanese Patent Laid-Open No. 2005-65789.

Patent Document 2: Japanese Patent Laid-Open No. 2002-71381.

Patent Document 3: Japanese Patent Laid-Open No. 2001-4408.

Patent Document 4: Japanese Patent Laid-Open No. 2005-283503.

Patent Document 5: U.S. Pat. No. 6,278,271.

DISCLOSURE OF THE INVENTION

The present invention is accomplished to achieve such objects, and comprises, in a physical quantity measuring instrument for detecting signals based on a desired physical quantity and for calculating the physical quantity by executing signal processing, a signal detecting component configured to detect a plurality of signals based on the physical quantity; a signal processing component configured to linearly combine the signals detected by the signal detecting component with coefficients that vary with time and include all the signal components based on the desired physical quantity; and an arithmetic processing component configured to calculate the physical quantity from signal data output by the signal processing component (corresponding to FIG. 6).

In addition, the signal detecting component is a three-dimensional vector physical quantity detecting component configured to detect a three-dimensional vector physical quantity, and has at least three detecting axes linearly independent of each other.

Besides, the signal detecting component can have three detecting axes orthogonal to each other.

Furthermore, the three-dimensional vector physical quantity detecting component can have at least two detecting axes which are not orthogonal to each other in the three detecting axes which are linearly independent of each other.

Moreover, the signal processing component can comprise: a sign control component configured to invert, with respect to required components, signs of individual signals from the three-dimensional vector physical quantity detecting component; a signal switching component configured to switch between inverted signals from the sign control component and non-inverted signals from the three-dimensional vector physical quantity detecting component; and an adding component configured to add the inverted signals and the non-inverted signals from the signal switching component.

In addition, the signal detecting component can further comprise: a second sign control component configured to invert, with respect to the required components, the signs of the individual signals; and a second signal switching component configured to switch between inverted signals and non-inverted signals from the second sign control component.

Besides, the second sign control component can invert sign relationships with respect to offset components included in the signals the signal detecting component detects and with respect to signals other than the offset components in the signals the signal detecting component detects.

Furthermore, the coefficients can be one of +1, −1 and 0, and the linear combinations can consist of combinations of the coefficients.

Moreover, the desired physical quantity can be three-dimensional components X, Y and Z of the three-dimensional vector physical quantity; the signal detecting component can be a three-dimensional vector physical quantity detecting component configured to detect a signal Hx based on the X component, a signal Hy based on the Y component and a signal Hz based on the Z component; and the linear combinations the signal processing component outputs can consist of Hx+Hy+Hz, Hx+Hy−Hz, Hx−Hy+Hz and −Hx+Hy+Hz (corresponding to FIG. 7).

In addition, the desired physical quantity can be three-dimensional components X, Y and Z of the three-dimensional vector physical quantity; the signal detecting component can be a three-dimensional vector physical quantity detecting component configured to detect a sum Hx+Hz=A of a signal Hx based on the X component and a signal Hz based on the Z component, a difference −Hx+Hz=B between the signals Hx and Hz, a sum Hy+Hz=C of a signal Hy based on the Y component and the signal Hz, and difference −Hy+Hz=D between the signals Hy and Hz; and the linear combinations the signal processing component outputs can consist of A+C, A+D, B+D and B+C (corresponding to FIG. 9).

Besides, the linear combinations the signal processing component outputs can consist of A+C, −A−D, B+D and −B−C (corresponding to FIG. 19).

Furthermore, the linear combinations the signal processing component outputs can consist of −A−C, A+D, −B−D and B+C.

Moreover, the linear combinations the signal processing component outputs can consist of A+C, A+D, B+D, B+C, −A−C, −A−D, −B−D, and −B−C (corresponding to FIG. 20).

In addition, the signal detecting component can have different detection sensitivity to three-dimensional components X, Y and Z of the desired three-dimensional vector physical quantity, and the signal processing component can correct the difference in the detection sensitivity by linearly combining the signals.

Besides, the three-dimensional vector physical quantity detecting component can be magnetic sensors.

Furthermore, the magnetic sensors can have a magnetic concentrator.

Moreover, the three-dimensional vector physical quantity detecting component can be acceleration sensors.

In addition, the desired physical quantity can be three components X, Y and Z of a magnetic field in a three-dimensional orthogonal coordinate system; the signal detecting component can have a plurality of Hall elements formed on a silicon substrate, and a disk-shaped magnetic concentrator; the Hall elements can be disposed on a circumference of the magnetic concentrator; and the arithmetic processing component can obtain signals based on the desired physical quantity using digital signals acquired from the signal processing component.

Besides, the Hall elements can be disposed on the circumference of the magnetic concentrator in four groups at every 90 degrees around the center of the magnetic concentrator.

Furthermore, the signal processing component can successively select and linearly combine signals of the Hall elements in adjacent groups.

Moreover, the desired physical quantity can be three components X, Y and Z of a magnetic field in a three-dimensional orthogonal coordinate system; the signal detecting component can have a plurality of Hall elements formed on a silicon substrate, and a disk-shaped magnetic concentrator; the Hall elements can be disposed on the circumference of the magnetic concentrator in four groups at every 90 degrees around the center of the magnetic concentrator; the individual groups of the Hall elements can detect signals Hx+Hz=A or −Hx+Hz=B or Hy+Hz=C or −Hy+Hz=D composed of a signal Hx based on the X component of the magnetic field, a signal Hy based on the Y component and a signal Hz based on the Z component; the signal processing component can have an A/D converting component configured to convert linear combinations A+C, A+D, B+D, B+C, −A−C, −A−D, −B−D and −B−C associated with the signals A to D to a digital signal from the signals A to D from the signal detecting component; and the arithmetic processing component can obtain the signals Hx, Hy and Hz based on the desired physical quantity from the digital signal acquired from the signal processing component.

In addition, the signal detecting component can have detecting sensitivity ratios 2:2:1 to the three components X, Y and Z of the magnetic field, and the signal processing component can adjust the detecting sensitivity ratios to the signals Hx, Hy and Hz obtained previously to 1:1:1 by linearly combining the outputs of the signal detecting component.

Besides, in a signal processing method in a physical quantity measuring instrument for detecting signals based on a desired physical quantity and for calculating the physical quantity by executing signal processing, the signal processing method comprises: a signal detecting step of detecting a plurality of signals based on the physical quantity by a signal detecting component; a signal processing step of linearly combining the signals detected at the signal detecting step with coefficients varying with time in a manner that all the signal components based on the desired physical quantity are included; and an arithmetic processing step of calculating the physical quantity from signal data output at the signal processing step (corresponding to FIG. 15).

Furthermore, the signal detecting step can be a three-dimensional vector physical quantity detecting step of detecting a three-dimensional vector physical quantity, and can detect signals with the signal detecting component having at least three detecting axes linearly independent of each other.

Moreover, the signal detecting step can detect the signals with the signal detecting component having three detecting axes orthogonal to each other.

In addition, the three-dimensional vector physical quantity detecting step can detect the signals with a three-dimensional vector physical quantity detecting component having three detecting axes which are linearly independent of each other and at least two of them are not orthogonal to each other.

Besides, the signal processing step can comprise: a sign control step of inverting, with respect to required components, signs of individual signals from the three-dimensional vector physical quantity detecting step; a signal switching step of switching between inverted signals from the sign control step and non-inverted signals from the three-dimensional vector physical quantity detecting step; and an adding step of adding the inverted signals and the non-inverted signals from the signal switching step.

Furthermore, the signal detecting step can further comprise: a second sign control step of inverting, with respect to the required components, the signs of the individual signals; and a second signal switching step of switching between inverted signals and non-inverted signals from the second sign control step.

Moreover, the second sign control step can invert sign relationships with respect to offset components included in the signals the signal detecting step detects and with respect to signals obtained by eliminating the offset components from the signals the signal detecting step detects.

In addition, the desired physical quantity can be three-dimensional components X, Y and Z of the three-dimensional vector physical quantity; the signal detecting step can be a three-dimensional vector physical quantity detecting step of detecting a signal Hx based on the X component, a signal Hy based on the Y component and a signal Hz based on the Z component; and the linear combinations the signal processing step outputs can be Hx+Hy+Hz, Hx+Hy−Hz, Hx−Hy+Hz and −Hx+Hy+Hz (corresponding to FIG. 16).

Besides, the desired physical quantity can be three-dimensional components X, Y and Z of the three-dimensional vector physical quantity; the signal detecting step can be a three-dimensional vector physical quantity detecting step of detecting a sum Hx+Hz=A of a signal Hx based on the X component and a signal Hz based on the Z component, a difference −Hx+Hz=B between the signals Hx and Hz, a sum Hy+Hz=C of a signal Hy based on the Y component and the signal Hz, and difference −Hy+Hz=D between the signals Hy and Hz; and the linear combinations the signal processing step outputs can consist of A+C, A+D, B+D and B+C (corresponding to FIG. 17).

Furthermore, the linear combinations the signal processing step outputs can consist of A+C, −A−D, B+D and −B−C.

Moreover, the linear combinations the signal processing step outputs can consist of −A−C, A+D, −B−D and B+C.

In addition, the linear combinations the signal processing step outputs can consist of A+C, A+D, B+D, B+C, −A−C, −A−D, −B−D, and −B−C.

According to the present invention, the physical quantity measuring instrument for detecting signals based on the desired physical quantity and for calculating the physical quantity by executing signal processing includes: the signal detecting component for detecting a plurality of signals based on the physical quantity; the signal processing component for linearly combining the signals detected by the signal detecting component in combinations varying with time; and the arithmetic processing component for calculating the physical quantity from signal data output by the signal processing component. Accordingly, it can reduce the noise component mixed in the physical quantity detecting unit or signal processing unit and improve the reliability without increasing the size or cost of the circuit.

BEST MODE FOR CARRYING OUT THE INVENTION

The embodiments in accordance with the present invention will now be described with reference to the accompanying drawings.

Figure 6:
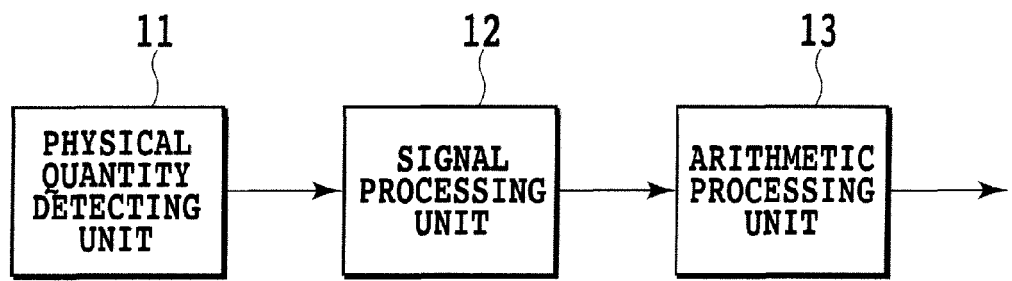
FIG. 6 is a diagram showing a whole configuration for explaining a physical quantity measuring instrument in accordance with the present invention.

FIG. 6 is a diagram showing a whole configuration of a physical quantity measuring instrument in accordance with the present invention. In FIG. 6, the reference numeral 11 designates a physical quantity detecting unit (corresponding to signal detecting component), 12 designates a signal processing unit, and 13 designates an arithmetic processing unit.

The present invention relates to a physical quantity measuring instrument that carries out signal processing for reducing a noise component mixed into the output signal when detecting a desired physical quantity from an acceleration sensor or magnetic sensor, for example. The physical quantity detecting unit 11 is for detecting a plurality of signals based on a desired physical quantity. The signal processing unit 12 is for performing signal processing for linearly combining the signals detected on individual detecting axes by the physical quantity detecting unit 11 in different combinations with time. The arithmetic processing unit 13 is for combining and calculating a plurality of signals that are corresponding to the physical quantity detected with physical quantity detection unit 11 which is involved with the signal data output from the signal processing unit 12.

It is preferable for the physical quantity detecting unit 11 and signal processing unit 12 to handle analog signals in the main, and for the arithmetic processing unit 13 to carry out processing in digital signals.

With such a configuration, as for the noise components mixed into the output signal when detecting the desired physical quantity, the signal processing unit 12 linearly combines the signals detected on the individual detecting axes by the physical quantity detecting unit 11 in different combinations with time, and the arithmetic processing unit 13 combines and calculating a plurality of signals that are corresponding to the physical quantity detected with physical quantity detection unit 11 which is involved with the signal data output from the signal processing unit 12, thereby being able to reduce the noise components mixed at the physical quantity detecting unit 11 and signal processing unit 12.

In other words, by linearly combining and outputting the signals from a plurality of detecting axes in combinations changing with time, and by calculating the outputs, it can obtain the desired signal components with their noise components being reduced.

Embodiment 1

Figure 7:
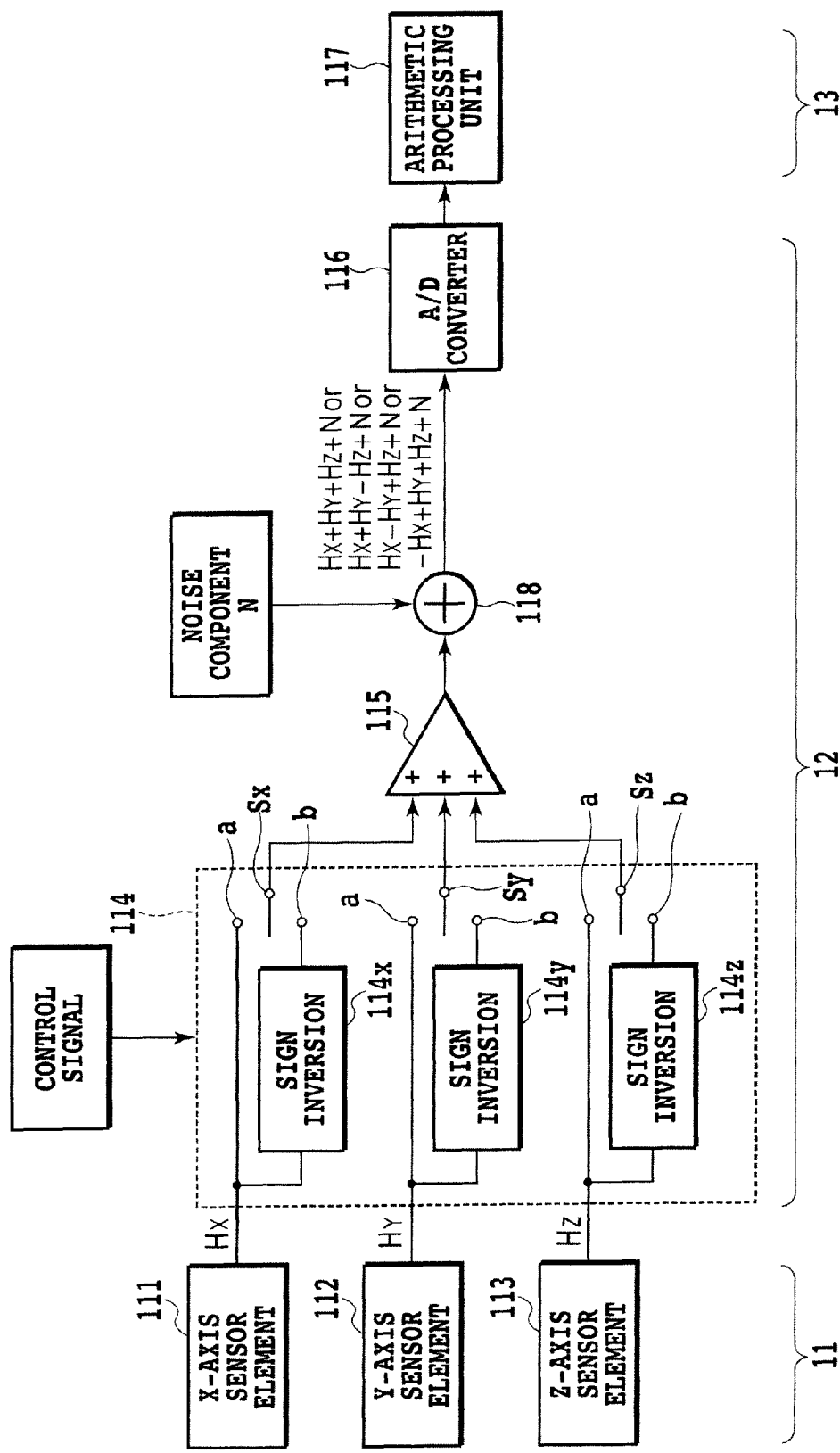
FIG. 7 is a block diagram showing a schematic configuration of a three-axis acceleration sensor as an embodiment 1 of a physical quantity measuring instrument in accordance with the present invention.

FIG. 7 is a block diagram showing a schematic configuration of a three-axis acceleration sensor, which is an embodiment 1 of the physical quantity measuring instrument in accordance with the present invention. Here, an X-axis sensor element 111, a Y-axis sensor element 112 and a Z-axis sensor element 113 correspond to the physical quantity detecting unit 11 in FIG. 6; a signal selecting unit 114, an operational amplifier 115 and an A/D converter 116 correspond to the signal processing unit 12 in FIG. 6; and an arithmetic processing unit 117 corresponds to the arithmetic processing unit 13 in FIG. 6. In addition, the reference numeral 118 designates a noise component added to the signal schematically.

As the acceleration sensor elements, Piezo-resistive sensors are suitable. However, any elements such as electrostatic capacitance sensors, piezoelectric sensors and thermal distribution detecting sensors can be used as long as they can detect acceleration.

In addition, although the following description is made by way of example using three-axis (or three) sensors, it is obvious that the same logic can be easily applied to the case where two or four or more sensors are used.

The signal selecting unit 114 includes sign inverters 114x, 114y and 114z for reversing, as to the components required, the signs of signals from three-dimensional vector physical quantity detecting units 111, 112 and 113; and switches (signal switching component) Sx, Sy and Sz for switching between the inverted signals from the sign inverters 114x, 114y and 114z and the non-inverted signals from the three-dimensional vector physical quantity detecting units 111, 112 and 113. The operational amplifier 115 is for adding the inverted signals and non-inverted signals from the switches Sx, Sy and Sz.

With such a configuration, the X-axis sensor element 111, Y-axis sensor element 112 and Z-axis sensor element 113 output a signal Hx based on the X-axis component of the physical quantity to be measured, a signal Hy based on the Y-axis component, and a signal Hz based on the Z-axis component; and the sign inverters 114x, 114y and 114z of the signal processing unit 114 adjust the polarity of the outputs, and inputs them to the operational amplifier 115. The signals Hx, Hy and Hz are amplified by the operational amplifier 115, and the noise component N is added to the output signal at that time.

The linear combinations the signal selecting unit 114 outputs are signals Hx+Hy+Hz, Hx+Hy−Hz, Hx−Hy+Hz, and −Hx+Hy+Hz based on the three-dimensional vector physical quantity components X, Y and Z in a three-axis coordinate system where three coordinate axes associated with the three-dimensional vector physical quantity detecting units 111, 112 and 113 are orthogonal to each other.

More specifically, when the switches Sx, Sy and Sz are connected to the "a" side, the output from the operational amplifier 115 becomes Hx+Hy+Hz+N; when the switches Sx and Sy are connected to the "a" side and the switch Sz is connected to the "b" side, the output from the operational amplifier 115 becomes Hx+Hy−Hz+N; when the switches Sx and Sz are connected to the "a" side and the switch Sy is connected to the "b" side, the output from the operational amplifier 115 becomes Hx−Hy+Hz+N; and when the switches Sy and Sz are connected to the "a" side and the switch Sx is connected to the "b" side, the output from the operational amplifier 115 becomes −Hx+Hy+Hz+N.

The output signal of the operational amplifier 115 is converted to a digital signal by the A/D converter 116. The signal thus obtained undergoes calculation by the arithmetic processing unit 117 to obtain any desired information concerning the physical quantity to be measured.

Figure 8:
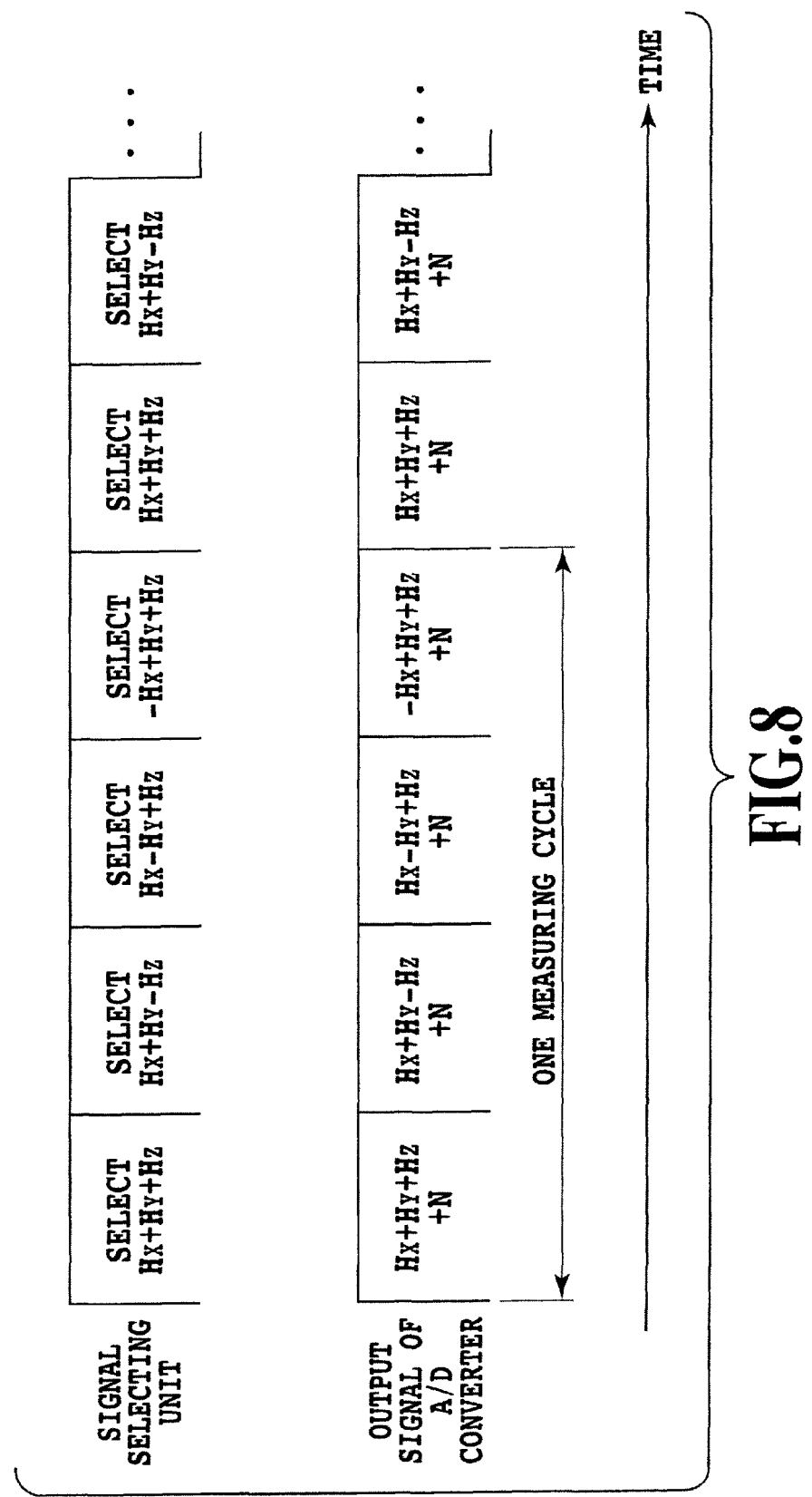
FIG. 8 is a schematic diagram of the output signal of the A/D converter when the signal processing unit shown in FIG. 7 makes a selection.

FIG. 8 is a schematic diagram of the output signal of the A/D converter when the signal processing unit shown in FIG. 7 makes a selection, which shows timing of the data obtained when acquiring the three-dimensional acceleration data continuously by the three-axis acceleration sensor. The upper row shows the signals selected by the signal processing unit, and the lower row shows the output signal of the A/D converter into which the noise components are mixed.

Figure 1:
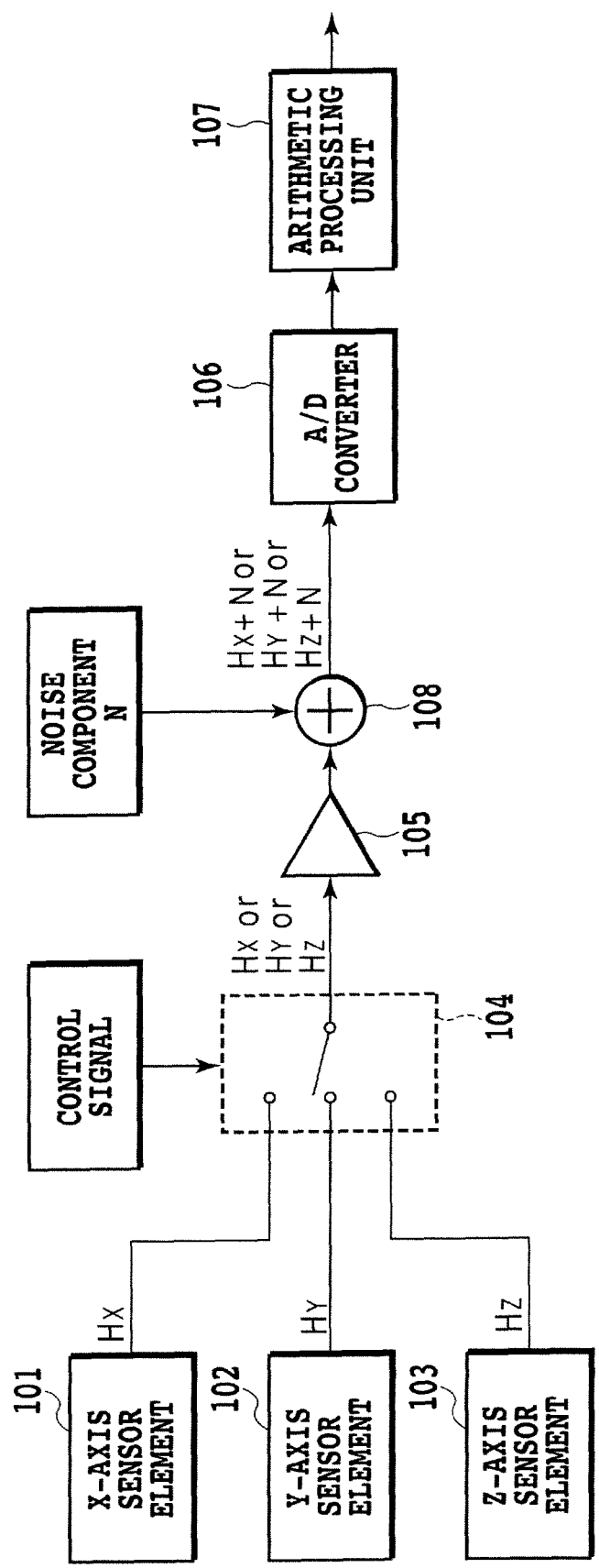
FIG. 1 is a block diagram showing a schematic configuration for explaining an example of a three-axis acceleration sensor as a conventional physical quantity measuring instrument.
Figure 2:
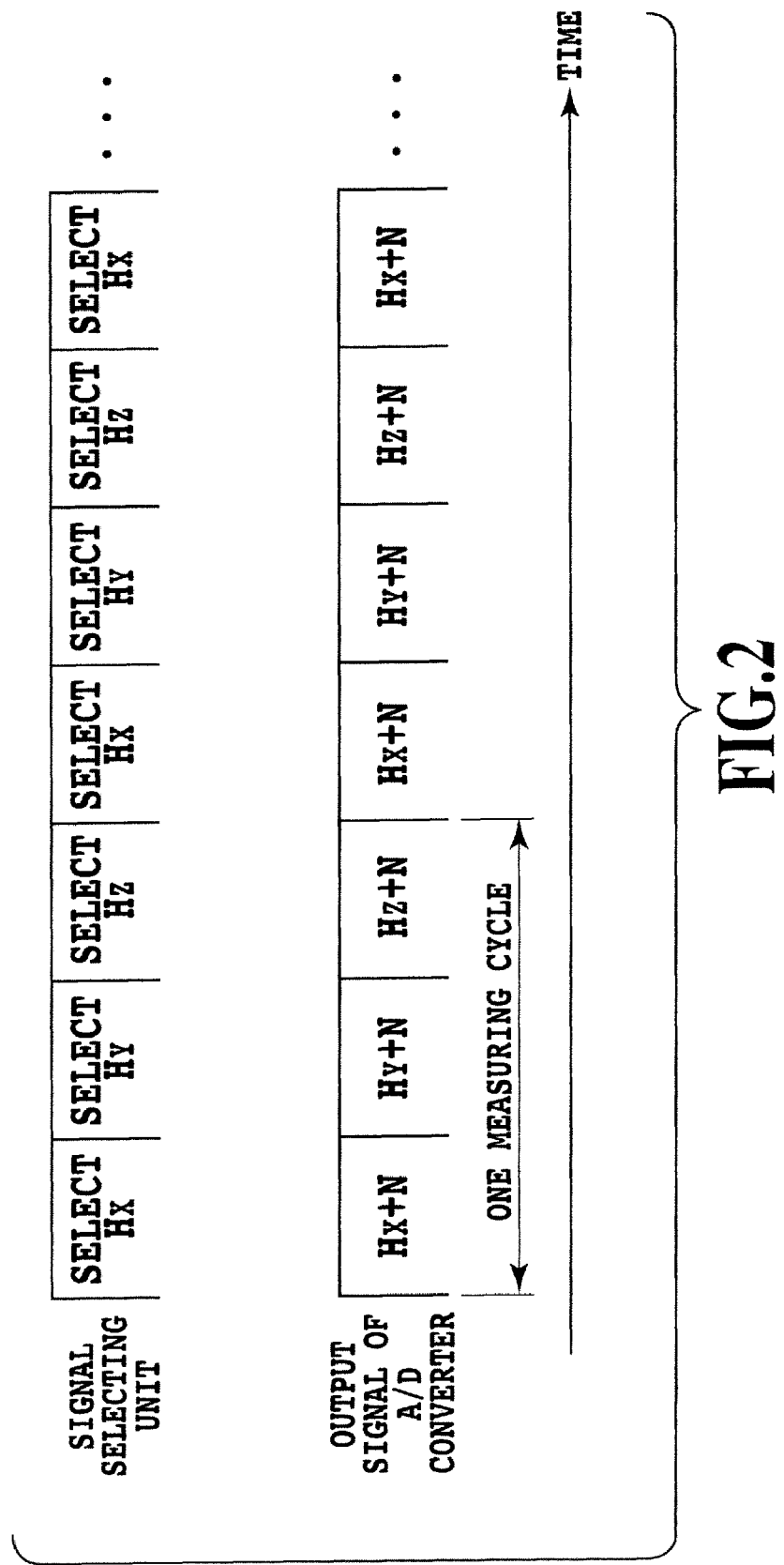
FIG. 2 is a schematic diagram of the output signal of an A/D converter in the conventional three-axis acceleration sensor.
Figure 3:
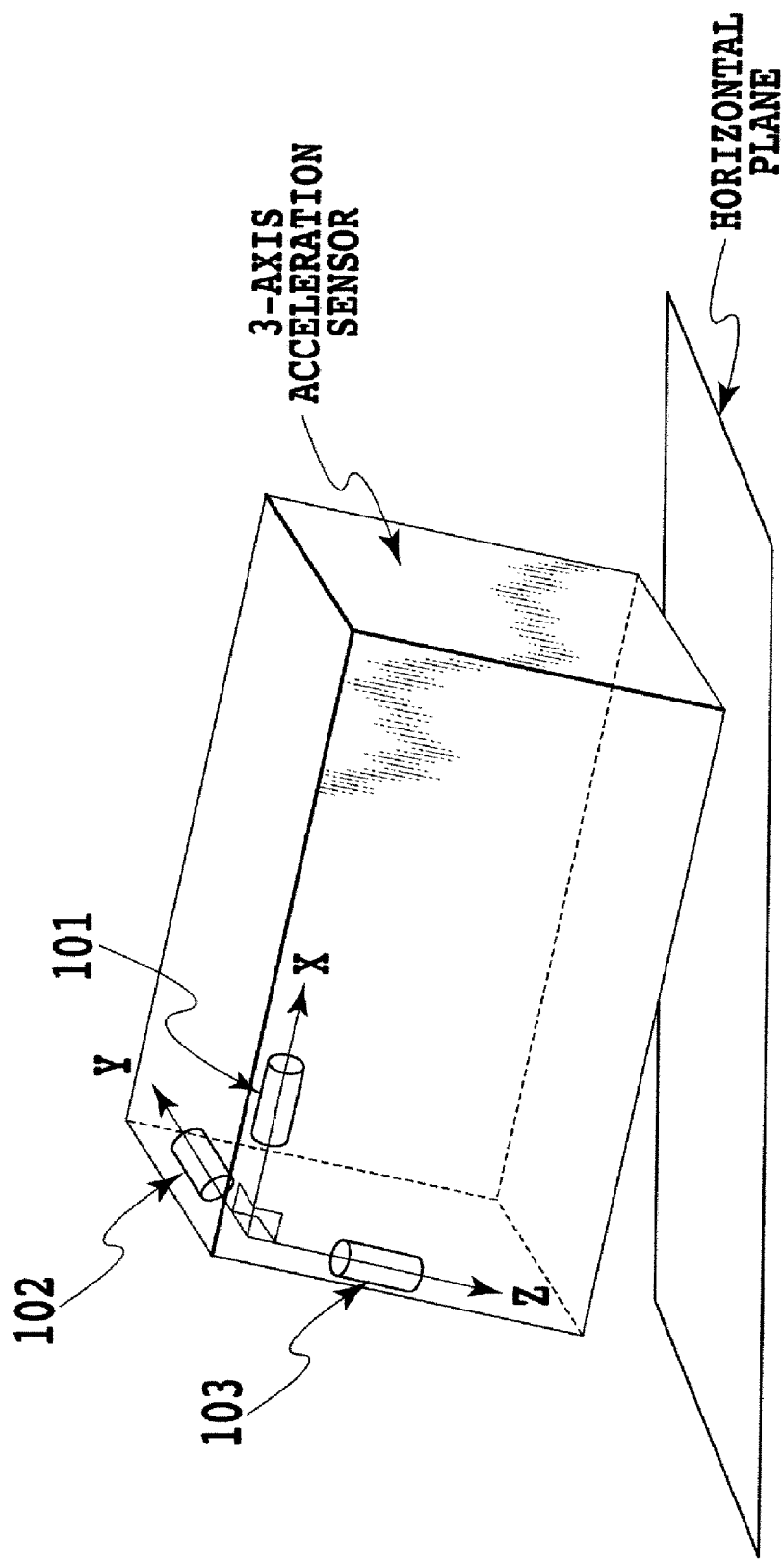
FIG. 3 is a schematic diagram of tilt angle measurement by the conventional three-axis acceleration sensor.
Figure 4:
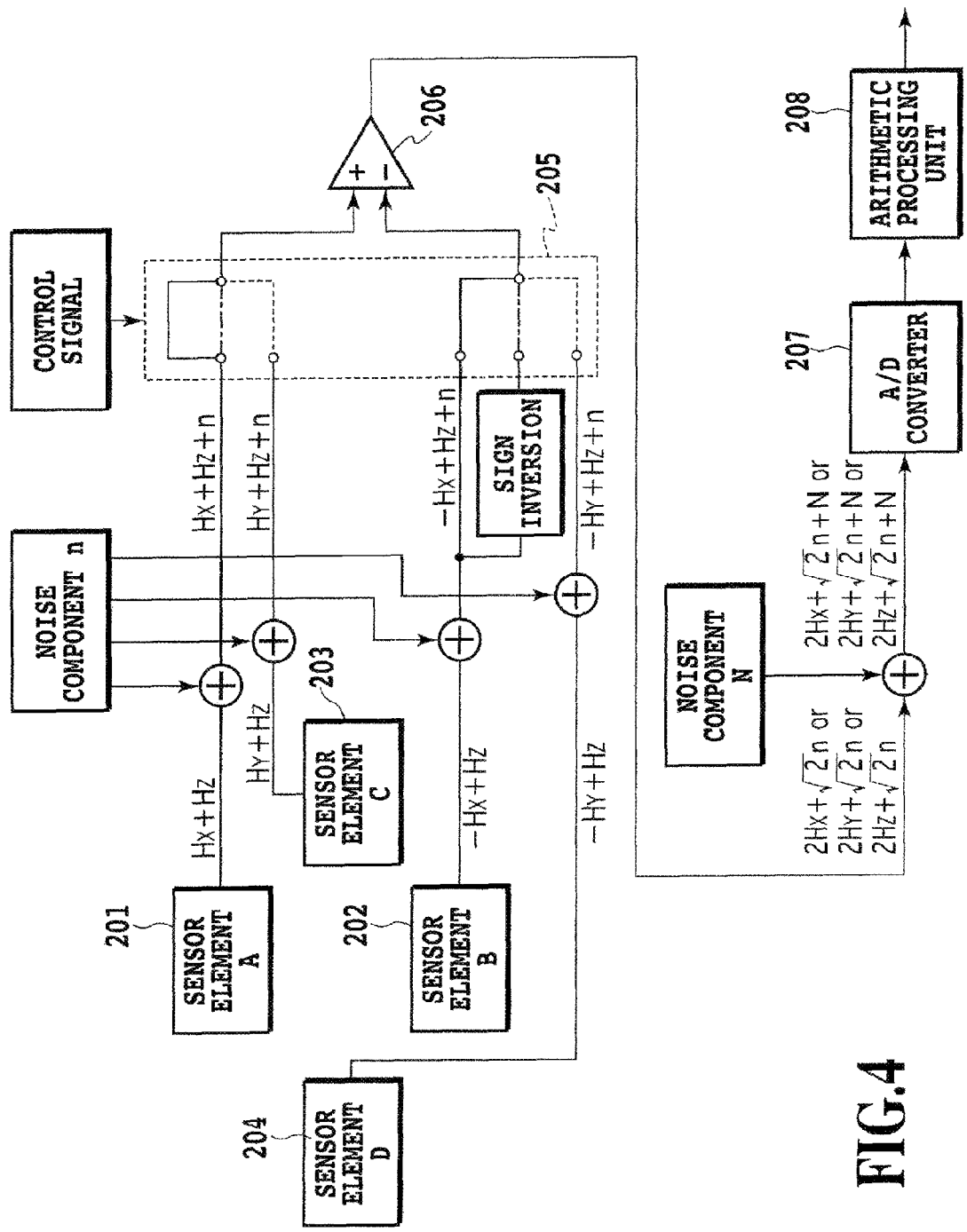
FIG. 4 is a block diagram showing a schematic configuration of a conventional magnetic sensor.
Figure 5:
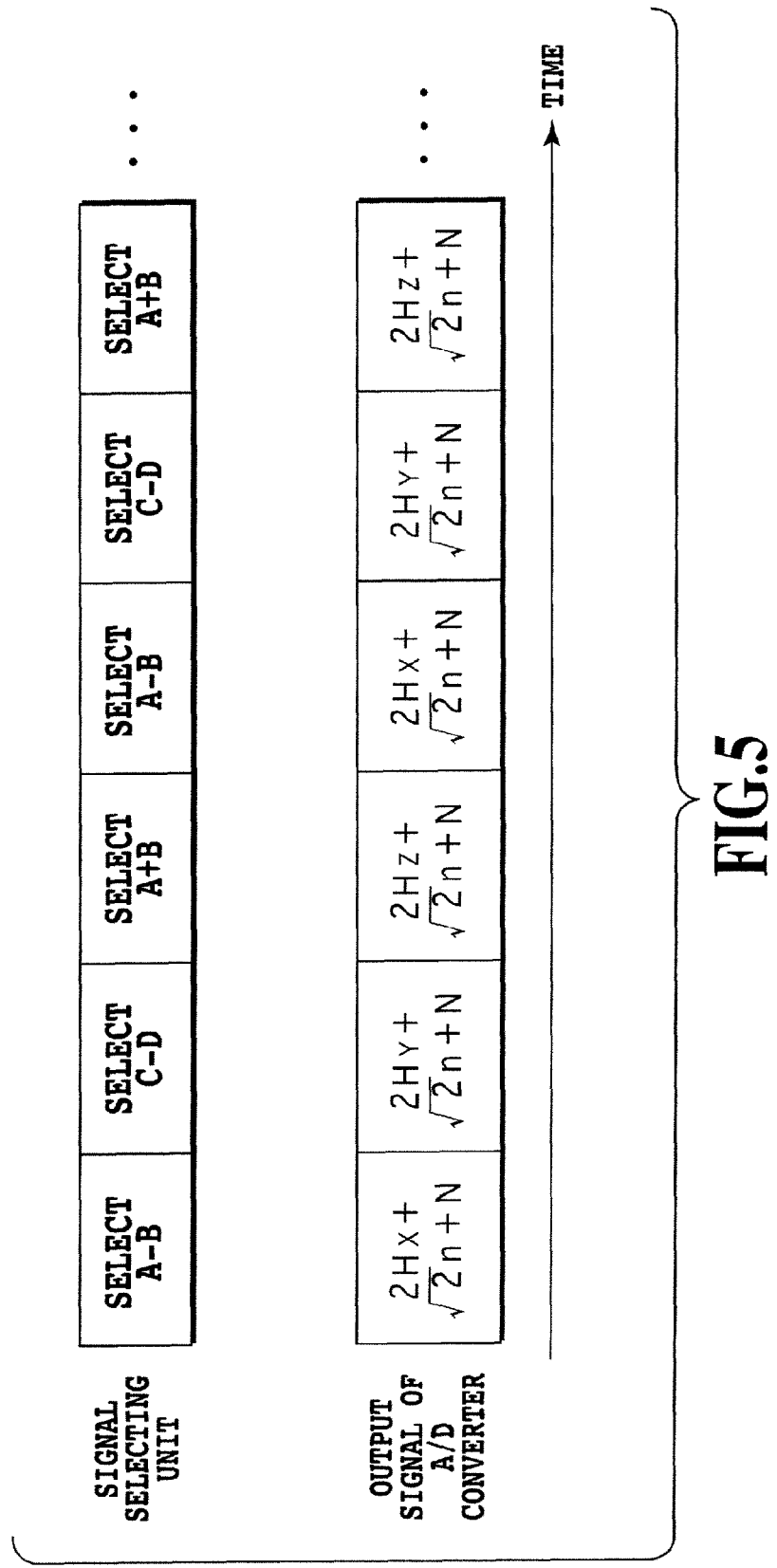
FIG. 5 is a schematic diagram of the output signal of the A/D converter when the signal selecting unit shown in FIG. 4 makes a selection.

As a concrete setting example of the signal selecting unit 114, let us consider a case where the signal Hx from the X-axis sensor element 111, the signal Hy from the Y-axis sensor element 112 and the signal Hz from the Z-axis sensor element 113 are linearly combined as follows and are output successively. In this case, the noise component N is added to each signal at the operational amplifier 115. To make the difference distinct between the advantage of the present example and that of the example shown FIG. 2 and FIG. 3, let us consider the case where the one measurement cycle is the same as that of FIG. 2 and FIG. 3. Although the signal selecting unit takes three states during the one measurement cycle and measures three types of signals in FIG. 2 and FIG. 3, the present embodiment (FIG. 7 and FIG. 8) measures four types of signals during one cycle. Accordingly, the measuring time of each type of the signals becomes 3/4 times. Generally, when the measuring time is made N times, the S/N ratio becomes √N times. Thus, actual S/N ratio should be √3/2 with a consideration of the difference in the measuring time.

$$(\alpha) = H_X + H_Y + H_Z + \frac{2}{\sqrt{3}} N_a \quad \text{[Expression 4]}$$

$$(\beta) = H_X + H_Y - H_Z + \frac{2}{\sqrt{3}} N_b$$

$$(\gamma) = H_X - H_Y + H_Z + \frac{2}{\sqrt{3}} N_c$$

$$(\delta) = -H_X + H_Y + H_Z + \frac{2}{\sqrt{3}} N_d$$

where individual noise components, which are mainly white noise, are designated by Na, Nb, Nc and Nd by adding subscripts to emphasize that there is no correlation between the noises components of (α), (β), (γ) and (δ).

From the output signals, the X component, Y component and Z component are obtained. To achieve this, using the output signal of the A/D converter 116, the arithmetic processing unit 117 obtains (α)+(β)+(γ)−(δ), (α)+(β)−(γ)+(δ) and (α)−(β)+(γ)+(δ).

$$(\alpha) + (\beta) + (\gamma) - (\delta) = 4H_X + \frac{2}{\sqrt{3}}(N_a + N_b + N_c - N_d) \quad \text{[Expression 5]}$$

$$(\alpha) + (\beta) - (\gamma) + (\delta) = 4H_Y + \frac{2}{\sqrt{3}}(N_a + N_b + N_c + N_d)$$

$$(\alpha) - (\beta) + (\gamma) + (\delta) = 4H_Z + \frac{2}{\sqrt{3}}(N_a + N_b + N_c + N_d)$$

The noise is calculated for each component obtained.

$$\left\langle \left| 4H_X - \frac{2}{\sqrt{3}}(N_a + N_b + N_c + N_d) \right|^2 \right\rangle = 4\left\langle \left| H_X + \frac{N}{\sqrt{3}} \right|^2 \right\rangle \quad \text{[Expression 6]}$$

$$\left\langle \left| 4H_Y + \frac{2}{\sqrt{3}}(N_a + N_b + N_c + N_d) \right|^2 \right\rangle = 4\left\langle \left| H_Y + \left(\frac{N}{\sqrt{3}}\right) \right|^2 \right\rangle$$

$$\left\langle \left| 4H_Z + \frac{2}{\sqrt{3}}(N_a + N_b + N_c + N_d) \right|^2 \right\rangle = 4\left\langle \left| H_Z + \frac{N}{\sqrt{3}} \right|^2 \right\rangle.$$

where <A> designates the expected value of A. From the foregoing expressions, it is found that the S/N ratio is improved √3 times compared with that in the conventional method.

However, since the present embodiment 1 does not have any influence on the noise caused by the sensor elements, the noise caused by the sensor elements is omitted. In addition, on obtaining the components corresponding to the individual axes, since the conventional ordinary multiaxial measuring instrument acquires the signals selectively from the sensor elements corresponding to the individual axes successively, the components corresponding to the individual axes are measured at slightly different timing, which can sometimes causes the distortion of the signal.

In contrast with this, the present embodiment 1 calculates the averages of the signals per one measurement cycle to obtain the outputs (α)-(δ). Accordingly, it can improve the problem of the conventional method in that the measuring timing differs for each of the components corresponding to the individual axes.

The combinations (α)-(δ) are an example, and the number of combinations can be four or more as long as it is not less than three. In addition, when the combinations are (α)-(δ), any three of them can be selected ((α), (β) and (γ), for example), and when expressing as $$\begin{pmatrix} \alpha \\ \beta \\ \gamma \end{pmatrix} = \begin{pmatrix} a_{00} & a_{01} & a_{02} \\ a_{10} & a_{11} & a_{12} \\ a_{20} & a_{21} & a_{22} \end{pmatrix} \begin{pmatrix} H_X \\ H_Y \\ H_Z \end{pmatrix} \equiv MH$$ [Expression 7]

any combinations will do as long as the coefficient matrix M is regular.

Embodiment 2

Figure 9:
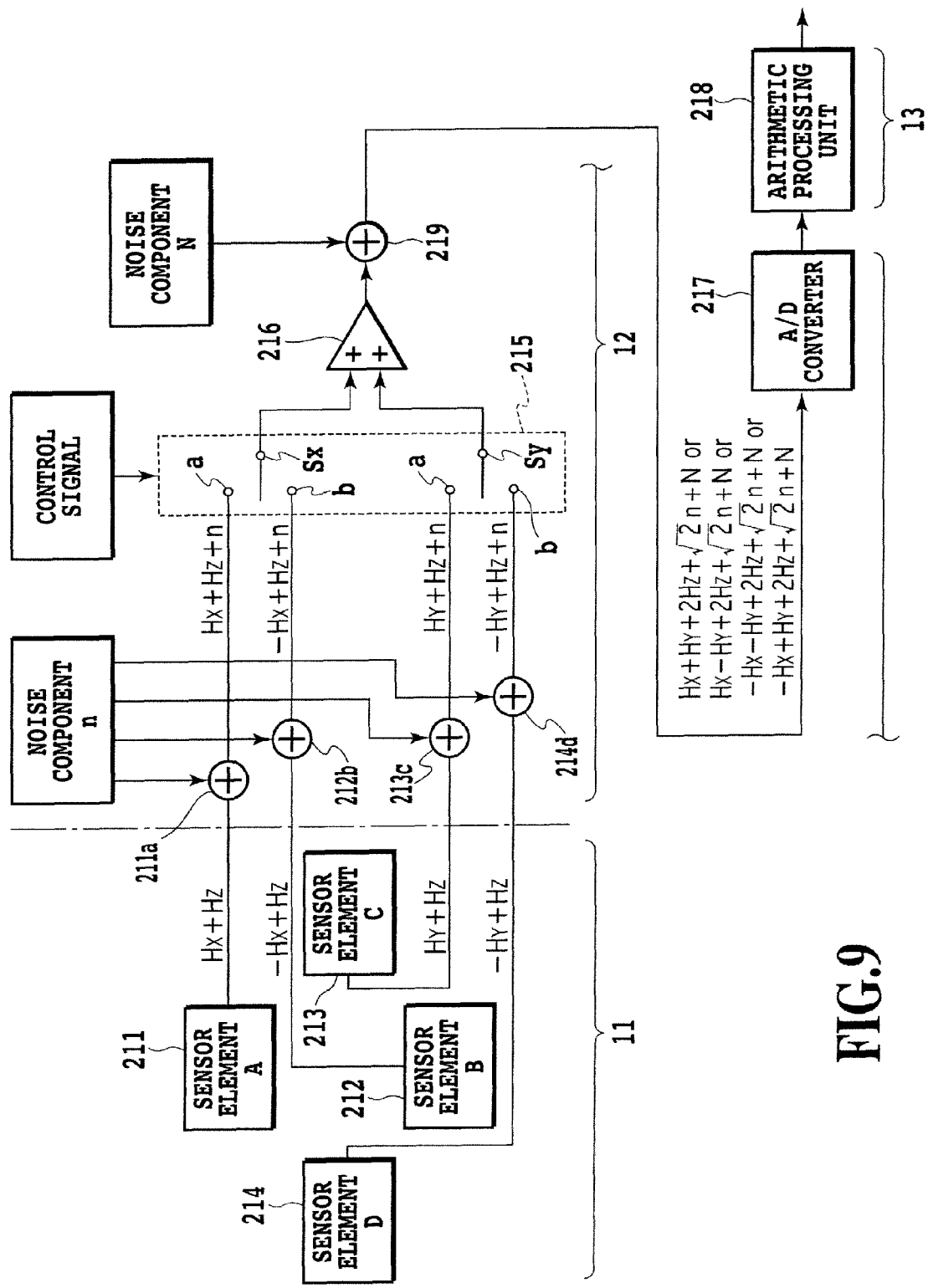
FIG. 9 is a block diagram showing a schematic configuration of a magnetic sensor as an embodiment 2 of the physical quantity measuring instrument in accordance with the present invention.
Figure 13A:
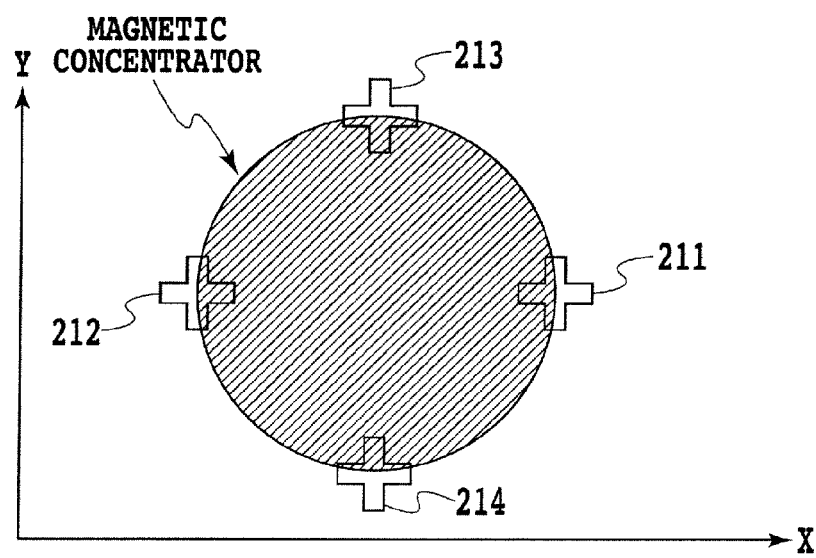
FIG. 13A is a projection onto an X-Y plane in a configuration example of the detecting unit of the embodiment 2 in accordance with the present invention.
Figure 13B:
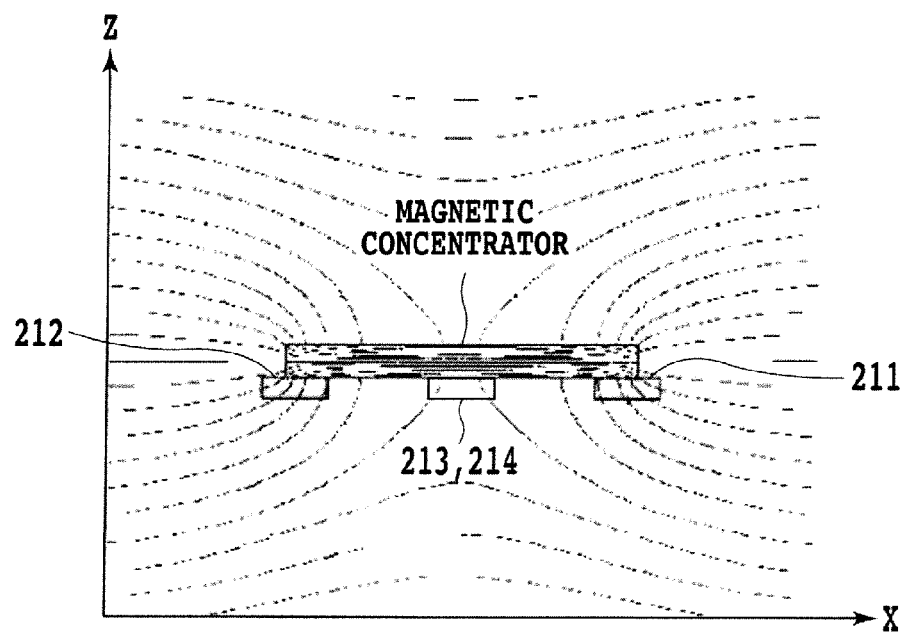
FIG. 13B is a projection onto an X-Z plane in the configuration example of the detecting unit of the embodiment 2 in accordance with the present invention.

FIG. 9 is a block diagram showing a schematic configuration of a magnetic sensor which is an embodiment 2 of the physical quantity measuring instrument in accordance with the present invention. FIG. 13A and FIG. 13B show a configuration example of the detecting unit of the embodiment 2 in accordance with the present invention, which has the same configuration as that of the Patent Document 2. Because of the effect of the magnetic concentrator, the sensor elements 211 and 212 can detect not only the signal based on the Z-axis component of the magnetic field, but also the signal based on the X-axis component; and the sensor elements 213 and 214 can detect not only the signal based on the Z-axis component of the magnetic field, but also the signal based on the Y-axis component simultaneously.

The magnetic concentrator consists of a ferromagnetic material, a material having a high relative permeability. In addition, the sensor elements 211-214, which have sensitivity to the magnetic components in the perpendicular direction, are disposed on the circumference of the disk-shaped magnetic concentrator in such a manner that they have rotational symmetry at every 90 degrees with respect to the center of the concentrator. The magnetic flux in the horizontal direction has its paths bent in the process of absorption into the magnetic concentrator, and comes to have components in the perpendicular direction. Thus, the sensor elements 212-214 detect the magnetic flux in the perpendicular direction, the paths of which are bent from the horizontal direction by the magnetic concentrator. Accordingly, they can output the signals proportional to the magnetic field intensity in the horizontal direction.

As for the shape of the magnetic concentrator, although it is preferably a disk-shape, it is not limited to that. For example, it can be a circular or rectangular. In addition, as for the thickness in the perpendicular direction, it can be any given thickness, can be uniform in the whole plane, or can have different thickness at the circumference and at the center.

As for the arrangement of the sensor elements, it can be rotational symmetry at every angle less than 90 degrees, that is, at every 45 degrees or 22.5 degrees. In addition, the sensor elements can have a configuration having a plurality of sensor elements connected in series or in parallel.

Here, the sensor element (A) 211, sensor element (B) 212, sensor element (C) 213 and sensor element (D) 214 correspond to the physical quantity detecting unit 11 in FIG. 6; the signal selecting unit 215, operational amplifier 216 and A/D converter 217 correspond to the signal processing unit 12 in FIG. 6; and the arithmetic processing unit 218 corresponds to the arithmetic processing unit 13 in FIG. 6. In addition, the reference numerals 211a, 212b, 213c, 214d and 219 designate the noise components added to the signals schematically.

Assuming that the signal based on the X-axis component in the magnetic field is Hx, the signal based on the Y-axis component is Hy, and the signal based on the Z-axis component is Hz, then the sensor elements 211-214 output the following signals each.

211: $H_x+H_z+n=A$

212: $-H_x+H_z+n=B$

213: $H_y+H_z+n=C$

214: $-H_y+H_z+n=D$ [Expression 8]

where n represents the noise component caused by the sensor elements.

Consider a case where the following patterns are successively output according to the setting of the signal selecting unit 215.

$(\alpha)=A+C=H_x+H_y+2H_z+\sqrt{2}n$ $(\beta)=A+D=H_x-H_y+2H_z+\sqrt{2}n$ $(\gamma)=B+D=-H_x-H_y+2H_z+\sqrt{2}n$ $(\delta)=B+C=-H_x+H_y+2H_z+\sqrt{2}n$ [Expression 9]

The signals are input to and amplified by the operational amplifier 216, and the noise component N caused by the operational amplifier 216 is added to its output signal at that time. The output signal of the operational amplifier 216 is converted to a digital signal by the A/D converter 217.

More specifically, the three-dimensional physical quantity detecting unit has a first sensor element (A) 211 for detecting the signals from the first-axis and third-axis in the three-axis coordinate system where the three coordinate axes are orthogonal to each other; a second sensor element (B) 212 for detecting the inverted signal of the first-axis and the signal from the third-axis; a third sensor element (C) 213 for detecting the signals from the second-axis and third-axis; and a fourth sensor element (D) 214 for detecting the inverted signal of the second-axis and the signal from the third-axis.

In addition, the signal processing unit 12 has a signal selecting unit 215 for selecting signals from the sensor elements 211-214, and an operational amplifier 216 for adding and amplifying the signals from the signal selecting unit 215.

Here, the plurality of detecting axes of the three-dimensional vector physical quantity detecting units 211-214 detect Hx+Hz=A, −Hx+Hz=B, Hy+Hz=C, −Hy+Hz=D consisting of the three-dimensional vector physical quantity components X, Y and Z in the three-axis coordinate system where the three coordinate axes associated with the three-dimensional vector physical quantity detecting units 211-214 are orthogonal to each other. Then, the linear combinations the signal selecting unit 215 outputs are A+C, A+D, B+C, and B+D.

With such a configuration, when the switches Sx and Sy are connected to the "a" side, the output (α) from the operational amplifier 216 based on the sensor elements A+C becomes Hx+Hy+2Hz+√2n+N; when the switch Sx is connected to the "a" side and the switch Sy is connected to the "b" side, the output (β) from the operational amplifier 216 based on the sensor elements A+D becomes Hx−Hy+2Hz+√2n+N; when the switches Sx and Sy are connected to the "b" side, the output (γ) from the operational amplifier 216 based on the sensor elements B+D becomes −Hx−Hy+2Hz+√2n+N; and when the switch Sx is connected to the "b" side and the switch Sy is connected to the "a" side, the output (δ) from the operational amplifier 216 based on the sensor elements B+C becomes −Hx+Hy+2Hz+√2n+N.

Using these outputs, the arithmetic processing unit 218 obtains the X-axis component from (α)+(β)−(γ)−(δ), the Y-axis component from (α)−(β)−(γ)+(δ), and the Z-axis component from (α)+(β)+(γ)+(δ).

Figure 10:
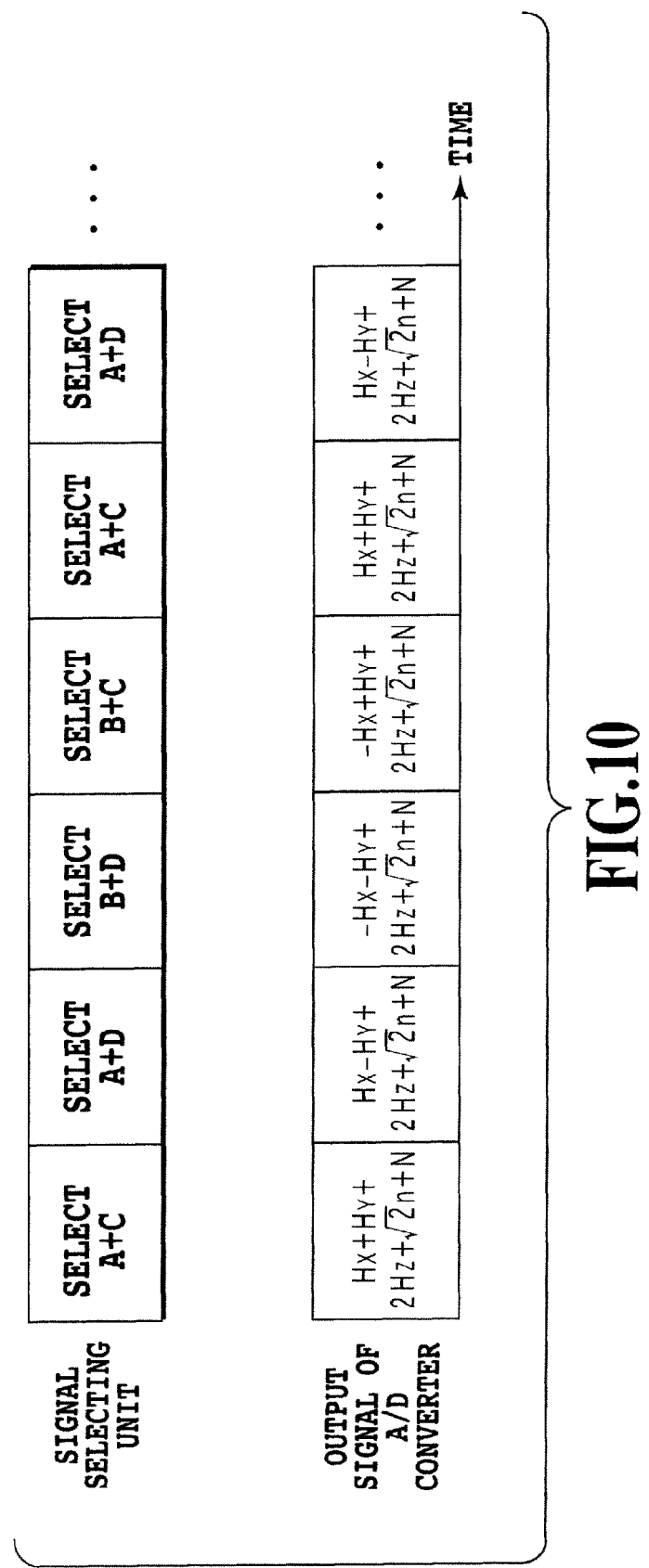
FIG. 10 is a schematic diagram of the output signal of the A/D converter when the signal processing unit shown in FIG. 9 makes a selection.

FIG. 10 is a diagram showing the output signal of the A/D converter when the signal processing unit shown in FIG. 9 makes a selection, which represents the timing of the data obtained when the magnetic sensor acquires the three-dimensional magnetic data continuously. The upper row shows the signal selected by the signal processing unit, and the lower row shows the output signal of the A/D converter into which the noise component is mixed.

As described above, the output from the operational amplifier 216 is as follows.

$$(\alpha) = H_x + H_y + 2H_z + \sqrt{2}n + N$$
$$(\beta) = H_x - H_y + 2H_z + \sqrt{2}n + N$$
$$(\gamma) = -H_x + H_y + 2H_z + \sqrt{2}n + N$$
$$(\delta) = -H_x + H_y + 2H_z + \sqrt{2}n + N \quad \text{[Expression 10]}$$

The arithmetic processing unit 218 obtains from the output signals the x-axis component as $(\alpha)+(\beta)-(\gamma)-(\delta)$, the Y-axis component as $(\alpha)-(\beta)-(\gamma)+(\delta)$, and the Z-axis component as $(+)+(\beta)+(\gamma)+(\delta)$, thereby resulting in the following.

$$\text{X component} \Rightarrow 4(H_x + n/\sqrt{2} + N/2)$$
$$\text{Y component} \Rightarrow 4(H_y + n/\sqrt{2} + N/2)$$
$$\text{Z component} \Rightarrow 8(H_z + n/2\sqrt{2}N/4) \quad \text{[Expression 11]}$$

Figure 11:
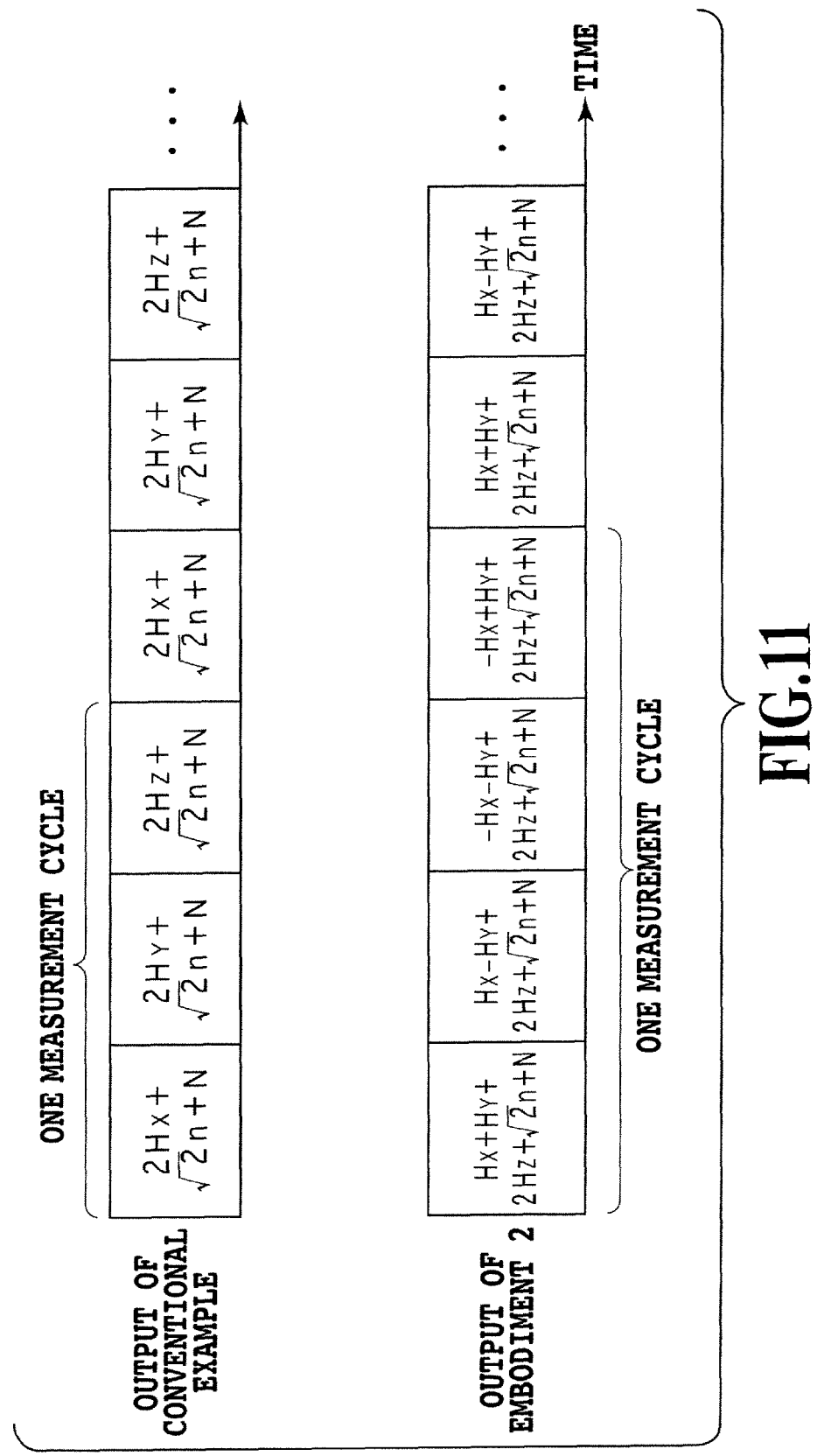
FIG. 11 is a schematic diagram comparing the measuring time in the conventional magnetic sensor with the measuring time in the embodiment 2 in accordance with the present invention.

Here, as for the number of steps necessary for obtaining the signals based on the X-axis, Y-axis and Z-axis components, let us compare the example of the conventional magnetic sensor with the present embodiment with reference to FIG. 11. In the conventional example shown in the upper row, the number of steps for obtaining the individual signals based on the X-axis, Y-axis and Z-axis components is three steps of $(\alpha)-(\gamma)$. In contrast, in the embodiment 2 in accordance with the present invention shown in the lower row, it requires four step measurement of $(\alpha)-(\delta)$.

Figure 12:
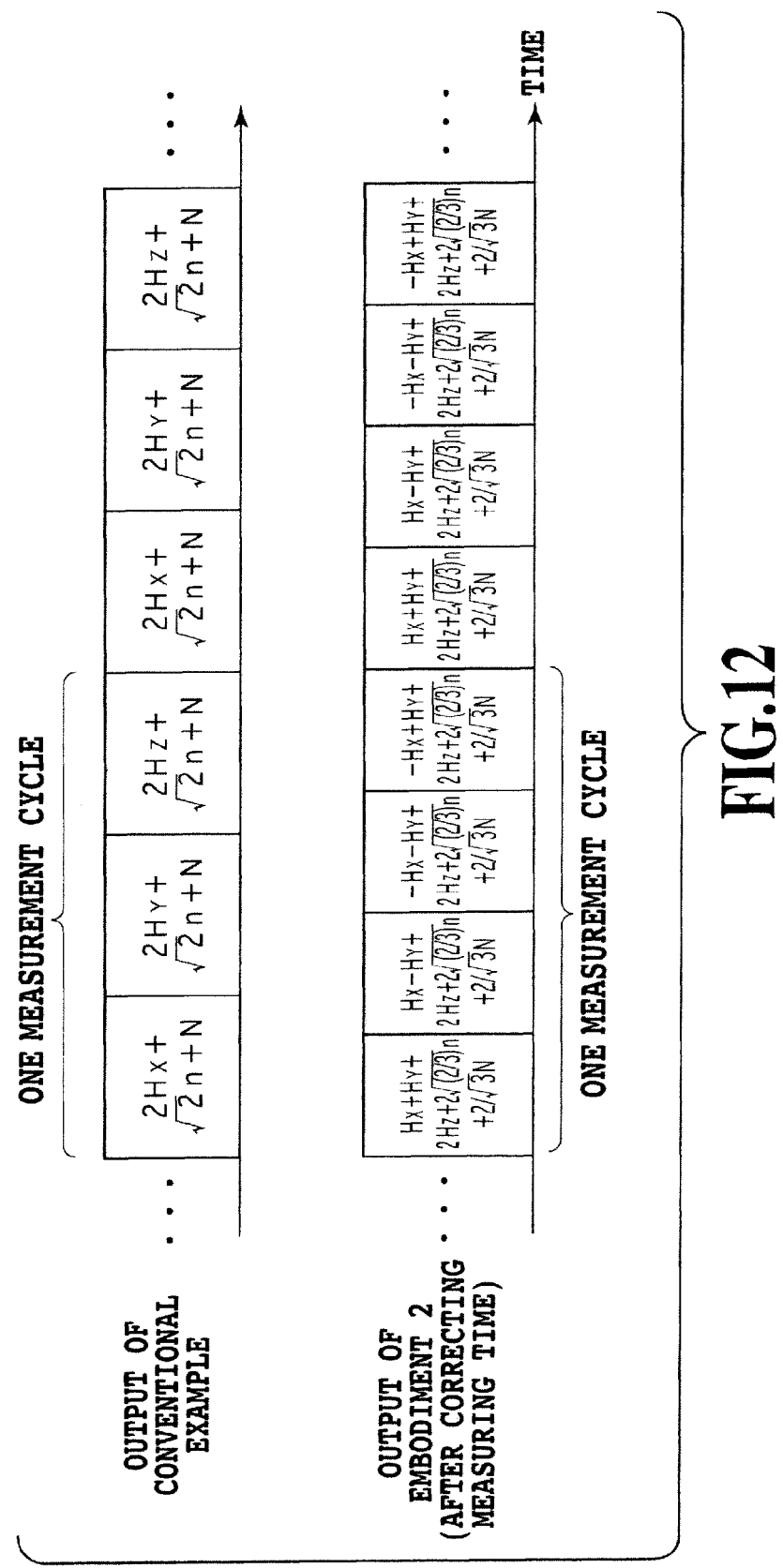
FIG. 12 is a schematic diagram comparing the measuring time in the conventional magnetic sensor with the measuring time in the embodiment 2 in accordance with the present invention when the measuring time is adjusted.

To compare the S/N ratios in the conventional example and the embodiment 2 under the assumption that the time taken to measure a set of the signals based on the X-axis, Y-axis and Z-axis components must be kept equal in the conventional example and embodiment 2, the measuring time of a single step in the embodiment 2 must be reduced to ¾ of the measuring time of a single step in the conventional example as shown in FIG. 12. The upper row of FIG. 12 shows the output in the conventional example that requires three-step measurement of $(\alpha)-(\delta)$. The lower row of FIG. 12 shows the output in embodiment 2 that requires four-step measurement of $(\alpha)-(\delta)$.

Generally, if the measuring time is made N times, the S/N ratio becomes $\sqrt{N}$ times. Thus, considering the difference in the measuring time per step, the relationships between the signal and noise of each component in the embodiment 2 are adjusted as follows.

$$\text{X component} \Rightarrow 4\left(H_X + \frac{\sqrt{2}}{\sqrt{3}}n + \frac{1}{\sqrt{3}}N\right) \quad \text{[Expression 12]}$$
$$\text{Y component} \Rightarrow 4\left(H_Y + \frac{\sqrt{2}}{\sqrt{3}}n + \frac{1}{\sqrt{3}}N\right)$$
$$\text{Z component} \Rightarrow 8\left(H_Z + \frac{\sqrt{2}}{2\sqrt{3}}n + \frac{1}{2\sqrt{3}}N\right)$$

Comparing the conventional example, as to the noise caused by the X-axis and Y-axis sensor elements and the noise caused by the amplifier, the S/N ratio of the embodiment 2 obtained as described above becomes $\sqrt{3}/2$ times that of the conventional example. However, as to the Z-axis component, both the noise caused by the sensor element and noise caused by the amplifier, the S/N ratio of the embodiment 2 is $\sqrt{3}$ times that of the conventional example, which means that the noise component can be reduced.

In addition, the S/N ratio for the Z-axis component is twice the S/N ratios for the X-axis and Y-axis components, which enables providing a bias to the noise for each component. Providing the bias to the noise makes it possible to eliminate the problem of the Patent Document 2 in that the S/N ratio of the Z-axis component is worse than the S/N ratios of the X-axis and Y-axis component; and to reduce noise more effectively for the component as to which it is difficult to suppress the noise component. This makes it possible to use a sensitivity improving component such as a magnetic concentrator more effectively so that further noise reduction effect can be expected as a whole.

Although the embodiment 2 makes the setting of the arithmetic processing unit 218 at $(\alpha)+(\beta)-(\gamma)-(\delta)$ to obtain the X-axis component, at $(\alpha)-(\beta)-(\gamma)+(\delta)$ to obtain the Y-axis component, and at $(\alpha)+(\beta)+(\gamma)+(\delta)$ to obtain the Z-axis component, other linear combinations can provide the same advantages.

The combinations $(\alpha)-(\delta)$ are only an example, and when selecting linearly independent three signals from $(\alpha)-(\delta)$, denoting them as L, M, and N, respectively, and representing the relationships between the signals Hx, Hy and Hz based on the physical quantities detected as follows, $$\begin{pmatrix} L \\ M \\ N \end{pmatrix} = \begin{pmatrix} a_{00} & a_{01} & a_{02} \\ a_{10} & a_{11} & a_{12} \\ a_{20} & a_{21} & a_{22} \end{pmatrix} \begin{pmatrix} H_X \\ H_Y \\ H_Z \end{pmatrix} \equiv MH \quad \text{[Expression 13]}$$

any combinations will do as long as the coefficient matrix M is regular.

Embodiment 3

Figure 14A:
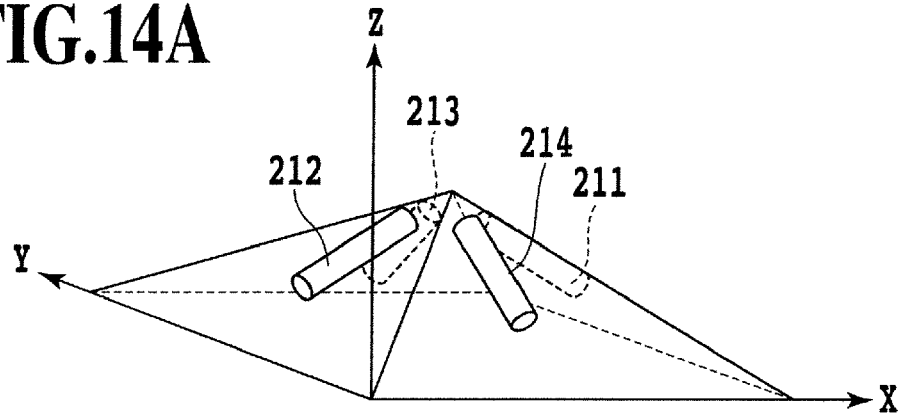
FIG. 14A is a diagram for explaining an embodiment 3 of the physical quantity measuring instrument in accordance with the present invention, a schematic diagram of a configuration example of the detecting unit.
Figure 14B:
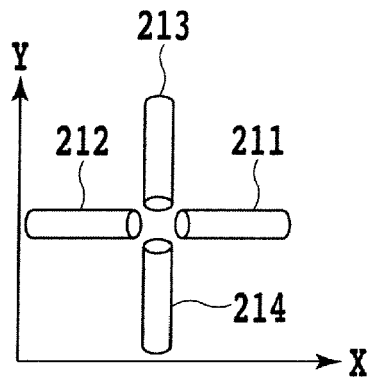
FIG. 14B is a diagram for explaining the embodiment 3 of the physical quantity measuring instrument in accordance with the present invention, a projection onto an X-Y plane in the configuration example of the detecting unit.
Figure 14C:
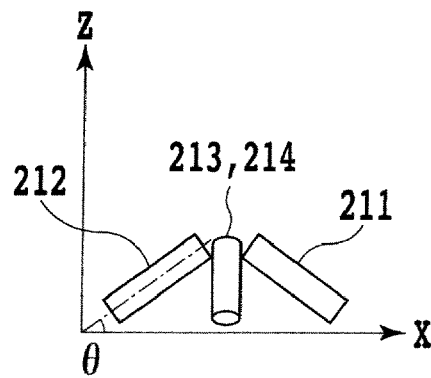
FIG. 14C is a diagram for explaining the embodiment 3 of the physical quantity measuring instrument in accordance with the present invention, a projection onto an X-Z plane in the configuration example of the detecting unit.

FIG. 14A, FIG. 14B and FIG. 14C are diagrams for explaining an embodiment 3 of the physical quantity measuring instrument in accordance with the present invention: FIG. 14A is a schematic diagram of a configuration example of the detecting unit; FIG. 14B is a projection of a configuration example B of the detecting unit onto the X-Y plane; and FIG. 14C is a projection of a configuration example C of the detecting unit onto the X-Z plane.

The configuration example B shown in FIG. 14B has the sensor elements 211-214 disposed over the X-Y plane and inclined in the Z-axis direction each at an angle θ with respect to the X-Y plane.

Unless the sensor elements 211-214 have inclination in the Z-axis direction, they detect only the components corresponding to the axes along which they are disposed such as the sensor elements 211 and 212 detect the signal based on the X-axis component of the magnetic field, and the sensor elements 213 and 214 detect the signal based on the Y-axis component of the magnetic field. In contrast, when each sensor element is inclined in the Z-axis direction at the angle θ with respect to the X-Y plane, each sensor element can detect not only the signal based on the component corresponding to the axis along which the sensor element is disposed, but also the signal based on the component in the Z-axis direction of the magnetic field simultaneously.

In the present embodiment, the ratios between the sensitivity Sx of the sensor elements 211 and 212 to the X-axis component of the magnetic field, the sensitivity Sy of the sensor elements 213 and 214 to the Y-axis component of the magnetic field, and the sensitivity Sz of each sensor element to the Z-axis component of the magnetic field are Sy/Sx=1 and Sz/Sx=Sz/Sy=tan θ.

Accordingly, the detecting unit of the present embodiment has the sensitivity Sz to Z-axis component different from the sensitivity Sx or Sy to the X-axis or Y-axis component, therefore using the conventional method such as in the Patent Document 2 has a problem in that the S/N ratio of the Z-axis component is lower than that of the X-axis or Y-axis component.

However, using configuration of the present embodiment makes it possible to reduce the noise more effectively about the component whose noise component is difficult to be suppressed in the same manner as the embodiment 2 in accordance with the present invention, thereby being able to reduce the effective noise component.

Figure 18A:
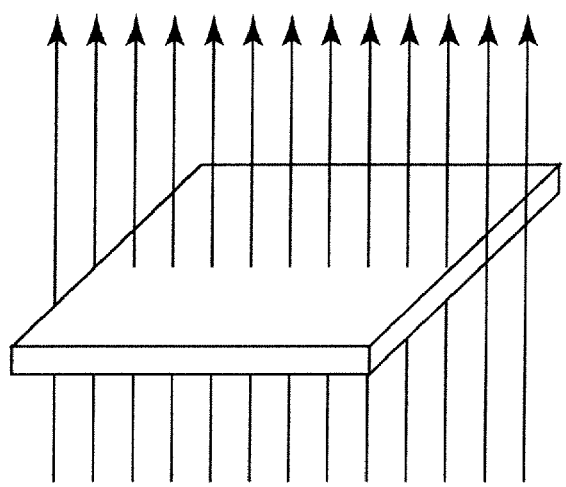
FIG. 18A is a schematic diagram for explaining the direction of a magnetic field component detected by the magnetic sensor element which is suitable for the configuration example of the embodiment 2 in accordance with the present invention.
Figure 18B:
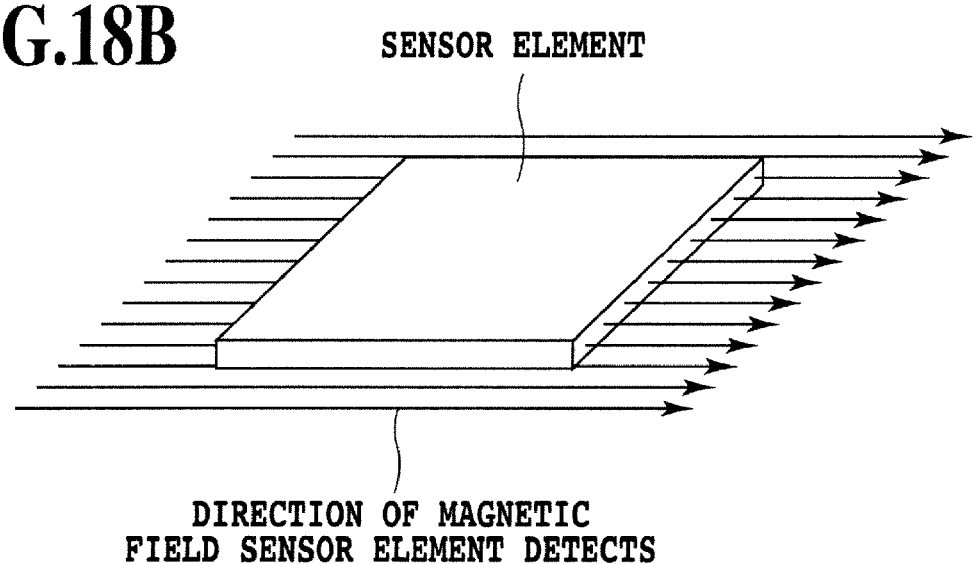
FIG. 18B is a schematic diagram for explaining the direction of a magnetic field component detected by the magnetic sensor element which is suitable for the configuration example of the embodiment 3 in accordance with the present invention.

As the magnetic sensor elements in the embodiment 2 in accordance with the present invention, Hall elements are suitable which can detect the magnetic field perpendicular to the elements as shown in FIG. 18A easily. In contrast, as the magnetic sensor elements in the embodiment 3 in accordance with the present invention, MI elements or MR elements are suitable which can detect the magnetic field parallel to the elements as shown in FIG. 18B easily.

Embodiment 4

Figure 19:
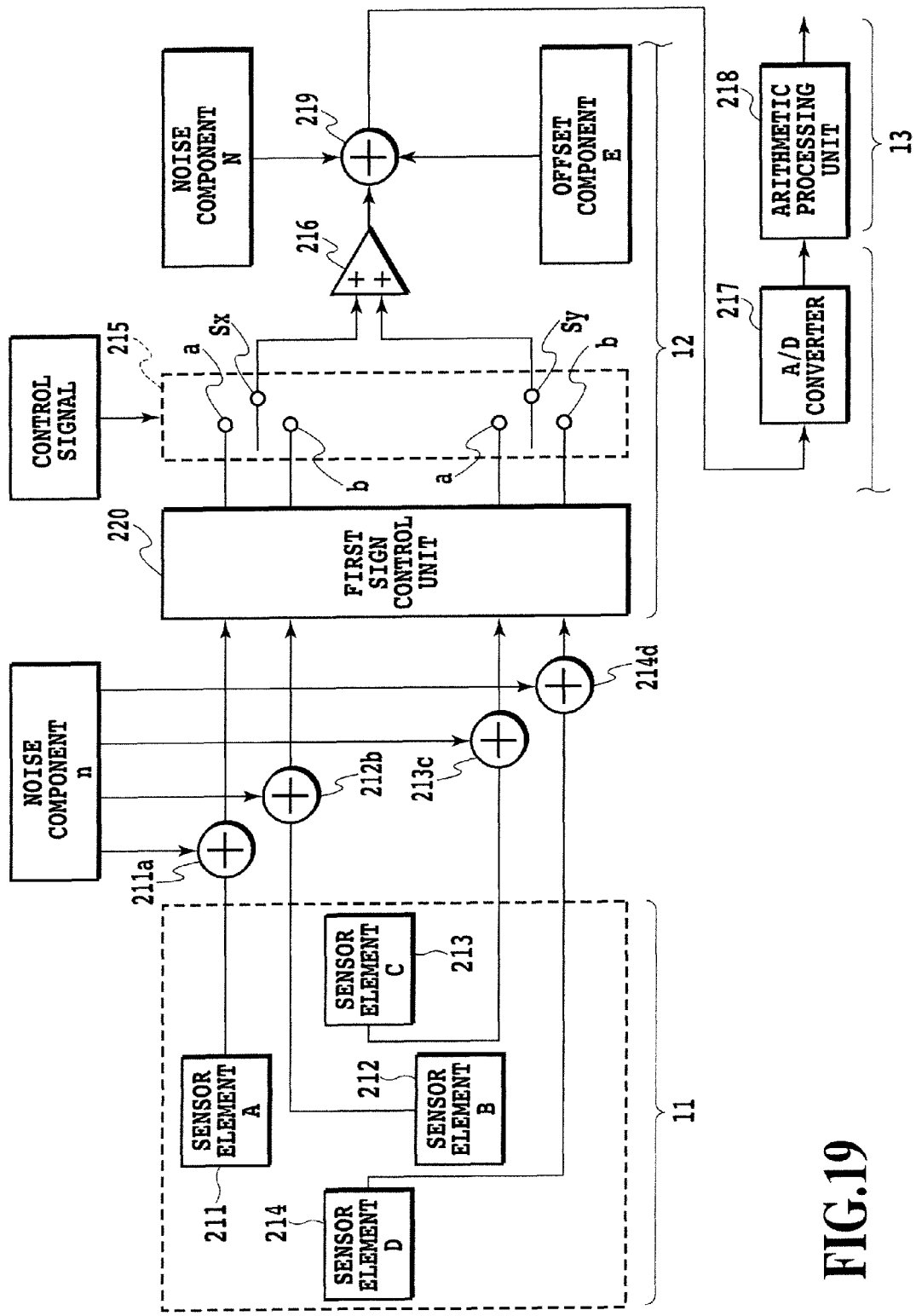
FIG. 19 is a block diagram showing a schematic configuration of a magnetic sensor as an embodiment 4 of the physical quantity measuring instrument in accordance with the present invention.

FIG. 19 is a block diagram showing a schematic configuration of a magnetic sensor of an embodiment 4 of the physical quantity measuring instrument in accordance with the present invention. The present embodiment 4 is an application of the embodiment 2 or 3 in accordance with the present invention. It has a first sign control unit 220 installed before the signal selecting unit 215 of FIG. 9 for inverting the signs of the signals, thereby making it possible to reduce the offset components of the signals without impairing the noise reduction effect described above.

In the present embodiment 4, a case will be considered which achieves the offset reduction effect by eliminating the offset component E occurring from the operational amplifier 216 to the A/D converter 217 from among the offset components contained in the signals.

When considering the offset component E, the foregoing output signals (α)-(δ) are expressed as follows.

$(\alpha) = Hx + Hy + 2Hz + \sqrt{2}n + N + E$ $(\beta) = Hx - Hy + 2Hz + \sqrt{2}n + N + E$ $(\gamma) = -Hx - Hy + 2Hz + \sqrt{2}n + N + E$ $(\delta) = -Hx + Hy + 2Hz + \sqrt{2}n + N + E$ In the case where the sign inverted signals are not used, when the X-axis component is obtained by $(\alpha)+(\beta)-(\gamma)-(\delta)$, the Y-axis component is obtained by $(\alpha)-(\beta)-(\gamma)+(\delta)$, and the Z-axis component is obtained by $(\alpha)+(\beta)+(\gamma)+(\delta)$, although the offset component E can be eliminated concerning the X-axis component and Y-axis component, the offset component E cannot be eliminated concerning the Z-axis component.

Here, consider the case where the first sign control unit 220 inverts the signs of the signals at the measurement of (β) and (δ). In this case, the output (β) from the operational amplifier 216 based on the sensor elements A+D and the output (δ) from the operational amplifier 216 based on the sensor elements B+C are as follows.

$(\beta') = -Hx + Hy - 2Hz + \sqrt{2}n + N + E$ $(\delta') = Hx - Hy - 2Hz + \sqrt{2}n + N + E$ Obtaining the X-axis component by $(\alpha)-(\beta')-(\gamma)+(\delta')$, the Y-axis component by $(\alpha)+(\beta')-(\gamma)-(\delta')$, and the Z-axis component sign by $(\alpha)-(\beta')+(\gamma)-(\delta')$ using the signals (β') and (δ') obtained by the inversion, the offset component E can be eliminated from all the three-axis components.

However, the signals whose signs are inverted by the first sign control unit 220 are not limited to the foregoing combinations (β') and (δ'). For example, it is also possible to invert the signs of the combinations (α') and (γ').

Embodiment 5

Figure 20:
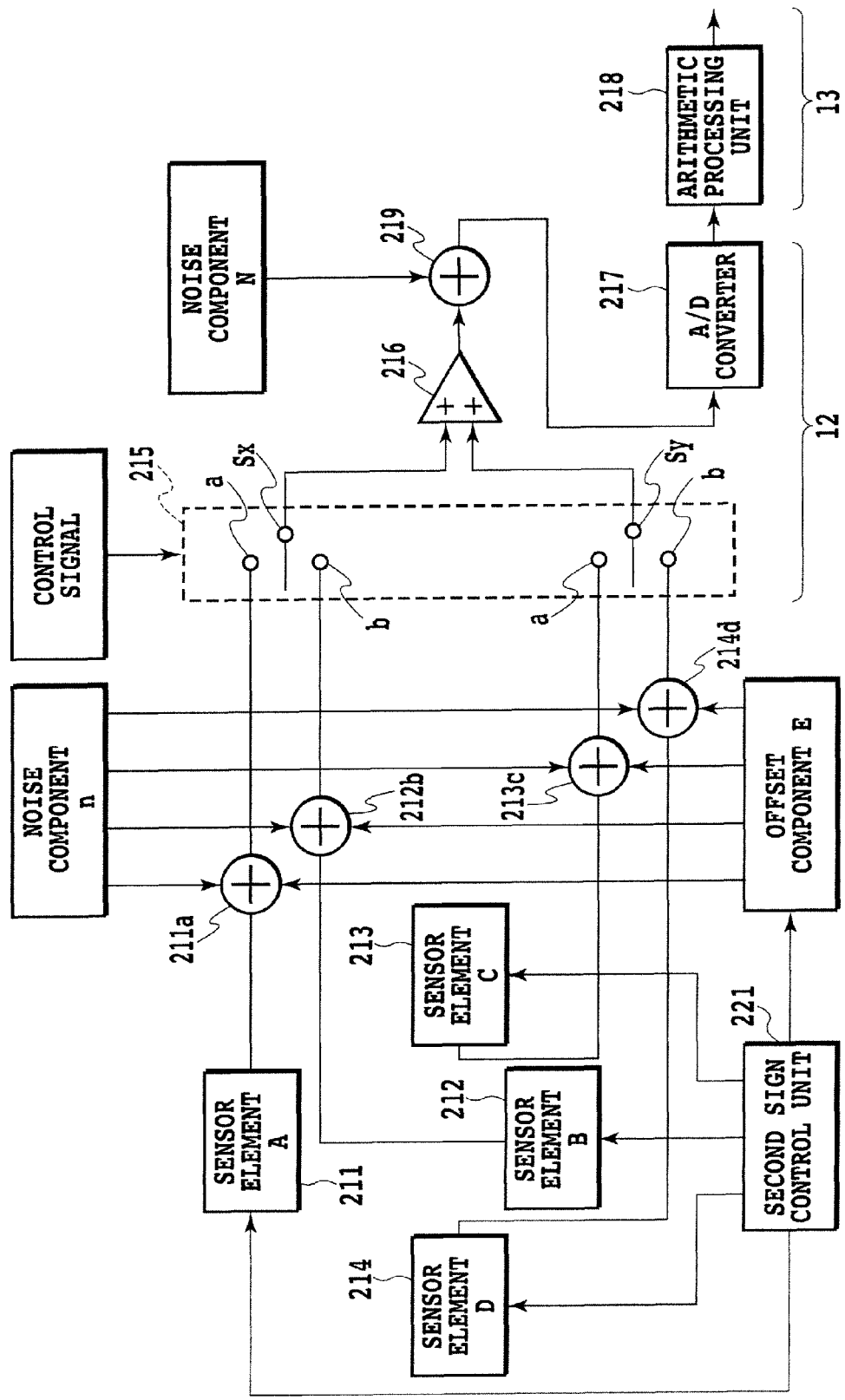
FIG. 20 is a block diagram showing a schematic configuration of a magnetic sensor as an embodiment 5 of the physical quantity measuring instrument in accordance with the present invention.

FIG. 20 is a block diagram showing a schematic configuration of a magnetic sensor of an embodiment 5 of the physical quantity measuring instrument in accordance with the present invention. As the foregoing embodiment 4, it is a configuration example of reducing the offset component without reducing the noise reduction effect.

In FIG. 20, a second sign control unit 221 can control the sign of each signal detected by the sensor elements 211-214 and the sign of the offset component e mixed by the components 211a-214d independently. An example suitable for the second sign control unit 221 can be implemented by a method using the chopper described in the Patent Document 4 or by a method of controlling the sign of the driving voltage of the sensor elements 211-214.

The present embodiment 5 obtains the non-inverted signals (α)-(δ) as follows without inverting the sign of each signal from the sensor elements 211-214 by the second sign control unit 221.

$(\alpha) = Hx + Hy + 2Hz + \sqrt{2}n + 2e + N$ $(\beta) = Hx - Hy + 2Hz + \sqrt{2}n + 2e + N$ $(\gamma) = -Hx - Hy + 2Hz + \sqrt{2}n + 2e + N$ $(\delta) = -Hx + Hy + 2Hz + \sqrt{2}n + 2e + N$ After that, it inverts the sign of each signal from the sensor elements 211-214 by the second sign control unit 221 to obtain the following inverted signals (α')-(δ').

$(\alpha') = -Hx - Hy - 2Hz + \sqrt{2}n + 2e + N$ $(\beta') = -Hx + Hy - 2Hz + \sqrt{2}n + 2e + N$ $(\gamma') = Hx + Hy - 2Hz + \sqrt{2}n + 2e + N$ $(\delta') = Hx - Hy - 2Hz + \sqrt{2}n + 2e + N$ Thus, the total of eight signals is acquired during the measurement of one set. Using the total of eight signals obtained by the signal processing unit 12, the arithmetic processing unit 13 calculates the differences between the non-inverted signals and the inverted signals $(\alpha)-(\alpha')$, $(\beta)-(\beta')$, $(\gamma)-(\gamma')$, and $(\delta)-(\delta')$, respectively, which enables eliminating the offset component e.

As for the sign inversion by the second sign control unit 221, instead of performing the sign inversion of each signal from the sensor elements 211-214 to obtain the inverted signals (α')-(δ'), the sign inversion of the offset component e which is mixed at the components 211a-214d schematically showing the noise components added to the signals can be carried out by the second sign control unit 221 to obtain the following signals (α'')-(δ'').

$(\alpha'') = Hx + Hy + 2Hz + \sqrt{2}n - 2e + N$ $(\beta'') = Hx - Hy + 2Hz + \sqrt{2}n - 2e + N$ $(\gamma'') = -Hx - Hy + 2Hz + \sqrt{2}n - 2e + N$ $(\delta'')=-Hx+Hy+2Hz+\sqrt{2}n-2e+N$ Substituting them for (α')-(δ') can achieve the same advantage.

A configuration is also possible which uses the embodiment 4 and embodiment 5 simultaneously to eliminate both the offset components E and e. As for the position of the first sign control unit in the embodiment 4 and that of the second sign control unit in the embodiment 5, any positions different from these positions of FIG. 19 or FIG. 20 are allowable as long as they are before the position at which the offset component E or e to be eliminated occurs.

In addition, although the embodiment 4 or 5 handles the offset components E and e in the assumption that their absolute values are invariable in the sign inversion, the absolute values of the offset components E and e can vary in an actual circuit. Even in such a case, it is difficult to eliminating the noise completely, however, it still offers the advantage of being able to reduce the offset components E and e.

Although the foregoing description is made about the three-axis acceleration sensor (embodiment 1) and magnetic sensor (embodiments 2-5), any sensor such as an angular velocity sensor can be used as long as they can detect a vector quantity. Alternatively, a combination of sensors detecting a variety of physical quantities simultaneously can be used other than the sensors detecting the vector quantities. For example, the physical quantity measuring instrument in accordance with the present invention is applicable to a device using a temperature sensor for detecting temperature as the X-axis sensor element 111, a humidity sensor for detecting humidity as the Y-axis sensor element 112, and a pressure sensor for detecting pressure as the Z-axis sensor element 113.

Furthermore, although the following are examples using three-axis (or three) sensors, it is obvious that the same theory can be applied to a case using two or four or more sensors.

Figure 15:
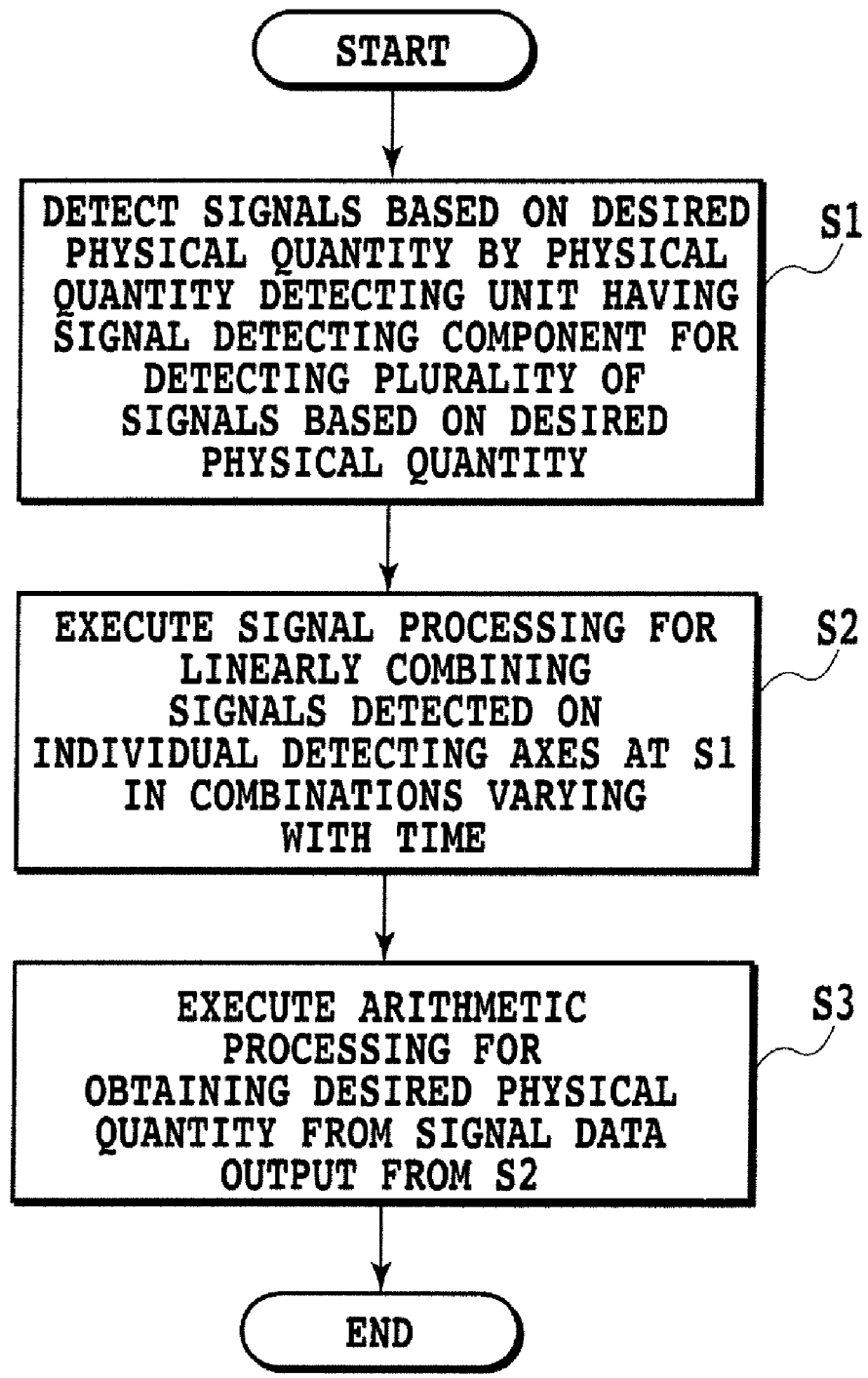
FIG. 15 is a flowchart for explaining a signal processing method in a physical measuring instrument in accordance with the present invention.

FIG. 15 is a flowchart for explaining a signal processing method in the physical measuring instrument in accordance with the present invention. The signal processing method in the physical quantity measuring instrument in accordance with the present invention carries out the signal processing for reducing the noise component mixed to the output signal when detecting the desired physical quantity.

First, the physical quantity detecting unit having the signal detecting components for detecting a plurality of signals based on a desired physical quantity detects the signals based on the desired physical quantity (step S1). Next, signal processing is executed for linearly combining the signals detected on the individual detecting axes at the physical quantity detecting step in different combinations with time (step S2). Next, arithmetic processing is executed for obtaining the desired physical quantity from the signal data output by the signal processing step (step S3).

Figure 16:
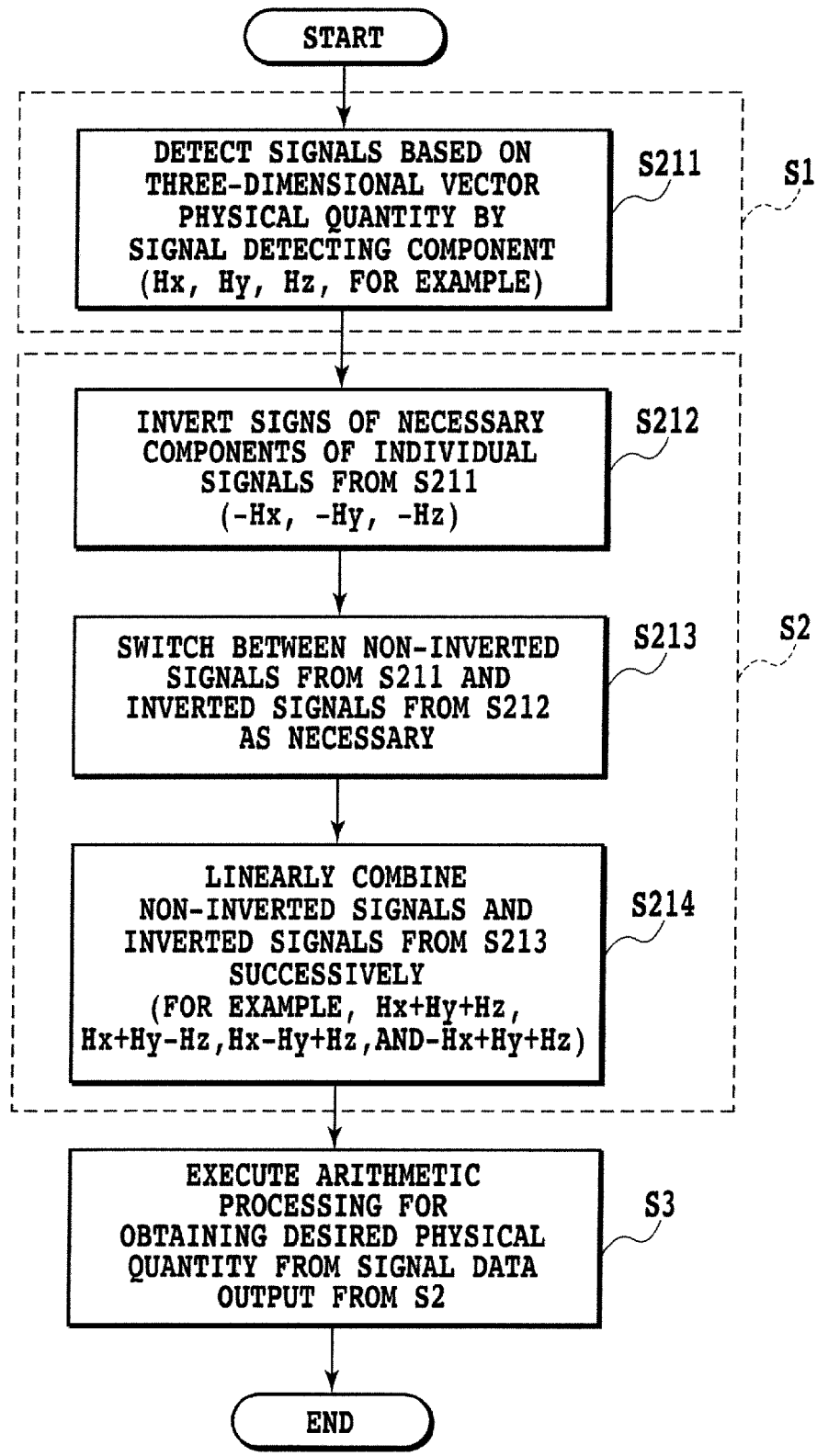
FIG. 16 is a flowchart for explaining a signal processing method of the embodiment 1 of the physical measuring instrument in accordance with the present invention.

FIG. 16 is a flowchart for explaining the signal processing method of the embodiment 1 of the physical measuring instrument in accordance with the present invention. Here, the physical quantity detecting step (step S1) shown in FIG. 15 consists of a step (step S211) of detecting the signals based on the three-dimensional vector physical quantity. In addition, the signal processing step (step S2) shown in FIG. 15 consists of a sign inversion step (step S212) for inverting the sign of necessary components of the individual signals from the three-dimensional vector physical quantity detecting step, a signal switching step (S213) for switching between the inverted signals from the sign inversion step and the non-inverted signals from the three-dimensional vector physical quantity detecting step, and a step (S214) of linearly combining the inverted signals and non-inverted signals from the signal switching step.

The linear combinations the signal processing step outputs are, for example, Hx+Hy+Hz, Hx+Hy−Hz, Hx−Hy+Hz, and −Hx+Hy+Hz consisting of the signal Hx based on the X component, the signal Hy based on the Y component and the signal Hz based on the Z component of the three-dimensional components X, Y and Z of the desired three-dimensional vector physical quantity.

Figure 17:
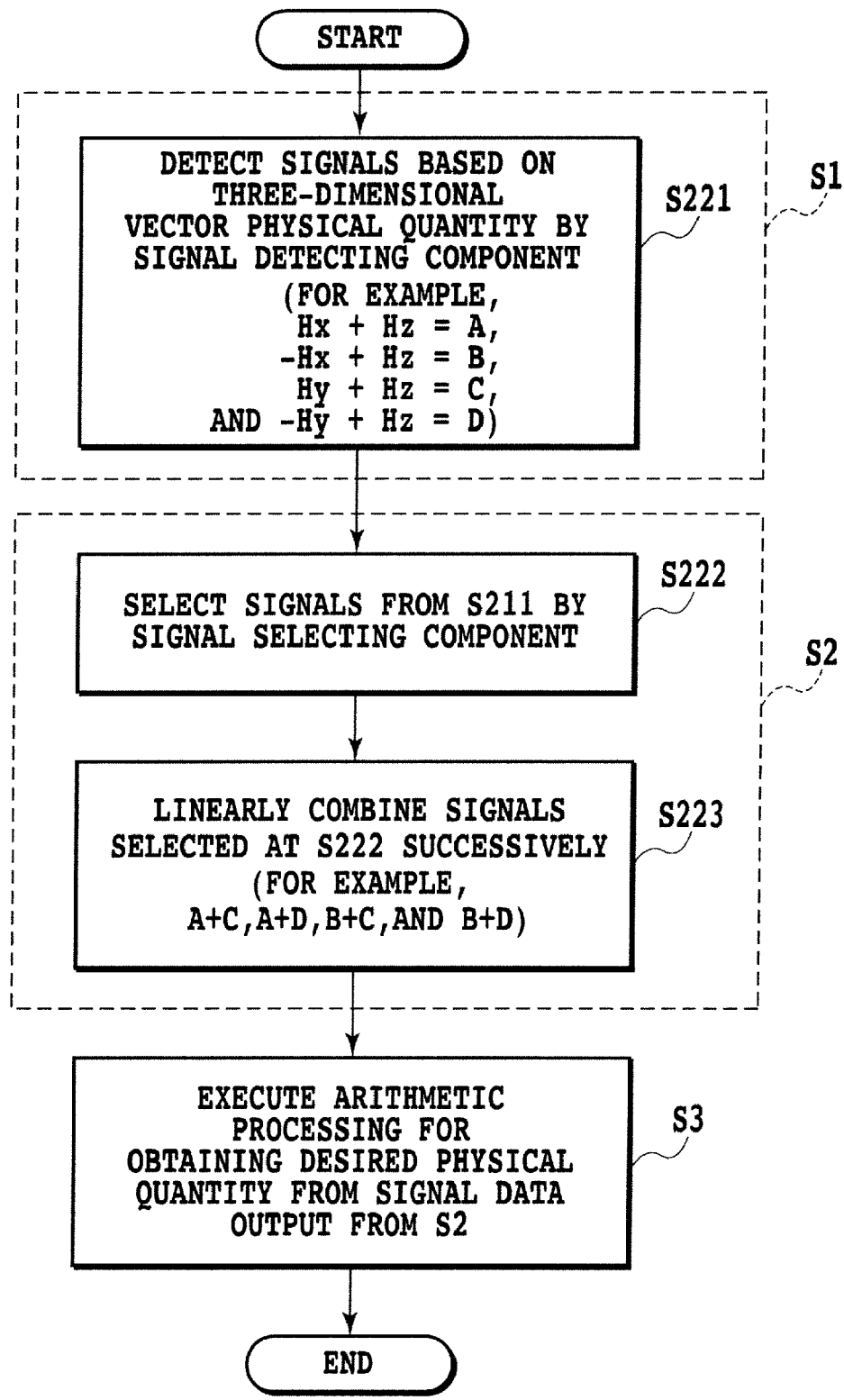
FIG. 17 is a flowchart for explaining a signal processing method of embodiments 2-5 of the physical measuring instrument in accordance with the present invention.

FIG. 17 is a flowchart for explaining the signal processing method of the embodiments 2-5 of the physical measuring instrument in accordance with the present invention. Here, the physical quantity detecting step (step S1) shown in FIG. 15 consists of a three-dimensional vector physical quantity detecting step of detecting, with respect to the signals corresponding to the first-axis to third-axis in the three-axis coordinate system where the three coordinate axes are orthogonal to each other, the signals from the first-axis and third-axis with the first sensor, the inverted signal from the first-axis and the signal from the third-axis with the second sensor, the signals from the second-axis and third-axis with the third sensor, and the inverted signal from the second-axis and the signal from the third-axis with the fourth sensor (step S221).

In addition, the signal processing step (step S2) shown in FIG. 15 consists of a signal selecting step (S222) for switching the signals from the physical quantity detecting step in response to the control signal, and a step (S223) of linearly combining the signals from the signal selecting step.

The three detection axes of three-dimensional vector physical quantity detecting step detect, for example, Hx+Hz=A, −Hx+Hz=B, Hy+Hz=C, and −Hy+Hz=D consisting of the signal Hx based on the X component, the signal Hy based on the Y component and the signal Hz based on the Z component of the three-dimensional components X, Y and Z of the desired three-dimensional vector physical quantity. In addition, the linear combinations the signal processing step outputs are A+C, A+D, B+C, and B+D, for example.

As for the term "linear combinations" of the signals in the present invention, it means addition of individual signals while changing their signs and intensity with the signal processing unit, and is not limited to the addition of the individual signals with their signs inverted.

In the present invention, the foregoing effect on the noise component n caused by the sensor elements is not limited to the noise component caused by the sensor elements. The same effect can be achieved as long as the noise component is a noise component before the position of the addition and amplification of the signals.

In the present invention, the foregoing effect on the noise component N caused by the operational amplifier is not limited to the noise component caused by the operational amplifier. The same effect can be achieved as long as the noise component is a noise component in the portion of the signal addition and operational amplifier, or is a noise component in a portion from the signal addition and operational amplifier to the A/D converter.

In the present invention, the detection sensitivity of the individual sensors can differ from sensor to sensor. Besides, according to the relationships between the size and S/N ratio of the sensors, the noise reduction effect in the present invention can be replaced by a miniaturization effect of the size of the sensors without deteriorating the S/N ratio as compared with the conventional devices.

In addition, according to the foregoing relationships between the measuring time and S/N ratio, the noise reduction effect in the present invention can be replaced by a measuring time reduction effect without deteriorating the S/N ratio as compared with the conventional devices.

Furthermore, according to the generally known relationship that the S/N ratio deteriorates as the power consumption of the sensors is reduced, the noise reduction in the present invention can be replaced by a power consumption reduction effect without deteriorating the S/N ratio as compared with the conventional devices.

Moreover, as for the denotating way of the three-dimensional components of the desired three-dimensional vector physical quantity in the embodiments in accordance with the present invention, it is not limited to the denotation in a particular coordinate system, but a denotation in a coordinate system undergoing any desired coordinate rotation of the coordinate system is possible.

Industrial Applicability

The present invention relates to a physical quantity measuring instrument and signal processing method thereof associated with the noise reduction in measuring the physical quantity with a plurality of sensor elements. In the physical quantity measuring instrument and signal processing method thereof which calculate the physical quantity by detecting the signals based on the desired physical quantity and by executing the signal processing, it is possible to reduce the noise component mixed in the physical quantity detecting unit or signal processing unit and to improve the reliability without increasing the size and cost of the circuit.

What is claimed is:

1. A physical quantity measuring instrument for detecting signals based on a desired physical quantity and for calculating the physical quantity by executing signal processing, the physical quantity measuring instrument comprising:
   a signal detecting component configured to detect a plurality of signals based on the physical quantity;
   a signal processing component configured to linearly combine the signals detected by the signal detecting component with coefficients that vary with time and include all the signal components based on the desired physical quantity; and
   an arithmetic processing component configured to calculate the physical quantity from signal data output by the signal processing component.

2. The physical quantity measuring instrument as claimed in claim 1, wherein the desired physical quantity is three-dimensional components X, Y and Z of the three-dimensional vector physical quantity;
   the signal detecting component is a three-dimensional vector physical quantity detecting component configured to detect a sum A of a signal Hx based on the X component and a signal Hz based on the Z component wherein A=Hx+Hz, a difference B between the signals Hx and Hz wherein B=−Hx+Hz, a sum C of a signal Hy based on the Y component and the signal Hz wherein C=Hy+Hz, and difference D between the signals Hy and Hz wherein D=−Hy+Hz; and
   the linear combinations of the signal processing component outputs consist of combinations that satisfy (A+C), (A+D), (B+D) and (B+C).

3. The physical quantity measuring instrument as claimed in claim 1, wherein the linear combinations the signal processing component outputs consist of combinations that satisfy (A+C), (−A−D), (B+D) and (−B−C).

4. The physical quantity measuring instrument as claimed in claim 1, wherein the linear combinations the signal processing component outputs consist of combinations that satisfy (−A−C), (A+D), (−B−D) and (B+C).

5. The physical quantity measuring instrument as claimed in claim 1, wherein the linear combinations the signal processing component outputs consist of combinations that satisfy (A+C), (A+D), (B+D), (B+C), (−A−C), (−A−D), (−B−D), and (B−C).

6. The physical quantity measuring instrument as claimed in claim 1, wherein the coefficients are one of +1, −1 and 0, and the linear combinations consist of combinations of the coefficients.

7. The physical quantity measuring instrument as claimed in claim 6, wherein
   the desired physical quantity is three-dimensional components X, Y and Z of the three-dimensional vector physical quantity;
   the signal detecting component is a three-dimensional vector physical quantity detecting component configured to detect a signal Hx based on the X component, a signal Hy based on the Y component and a signal Hz based on the Z component; and
   the linear combinations of the signal processing component outputs consist of combinations that satisfy (Hx+Hy+Hz), (Hx+Hy−Hz), (Hx−Hy+Hz) and (−Hx+Hy+Hz).

8. The physical quantity measuring instrument as claimed in claim 1, wherein
   the desired physical quantity is three components X, Y and Z of a magnetic field in a three-dimensional orthogonal coordinate system;
   the signal detecting component has a plurality of Hall elements formed on a silicon substrate, and a disk-shaped magnetic concentrator;
   the Hall elements are disposed on the circumference of the magnetic concentrator in four groups at every 90 degrees around the center of the magnetic concentrator;
   the individual groups of the Hall elements detect signals A or B or C or D composed of a signal Hx based on the X component of the magnetic field, a signal Hy based on the Y component and a signal Hz based on the Z component, wherein A=Hx+Hz, B=−Hx+Hz, C=Hy+Hz, and D=−Hy+Hz;
   the signal processing component has an A/D converting component configured to convert linear combinations that satisfy (A+C), (A+D), (B+D), (B+C), (−A−C), (−A−D), (−B−D) and (−B−C) associated with the signals A to D to a digital signal from the signals A to D from the signal detecting component; and
   the arithmetic processing component obtains the signals Hx, Hy and Hz based on the desired physical quantity from the digital signal acquired from the signal processing component.

9. The physical quantity measuring instrument as claimed in claim 8, wherein
   the signal detecting component has detecting sensitivity ratios 2:2:1 to the three components X, Y and Z of the magnetic field, and the signal processing component adjusts the detecting sensitivity ratios to the signals Hx, Hy and Hz obtained previously to 1:1:1 by linearly combining the outputs of the signal detecting component.

10. The physical quantity measuring instrument as claimed in claim 1, wherein
    the desired physical quantity is three components X, Y and Z of a magnetic field in a three-dimensional orthogonal coordinate system;
    the signal detecting component has a plurality of Hall elements formed on a silicon substrate, and a disk-shaped magnetic concentrator;

the Hall elements are disposed on a circumference of the magnetic concentrator; and the arithmetic processing component obtains signals based on the desired physical quantity using digital signals acquired from the signal processing component.

11. The physical quantity measuring instrument as claimed in claim 10, wherein the Hall elements are disposed on the circumference of the magnetic concentrator in four groups at every 90 degrees around the center of the magnetic concentrator.

12. The physical quantity measuring instrument as claimed in claim 10, wherein the signal processing component successively selects and linearly combines signals of the Hall elements in adjacent groups.

13. The physical quantity measuring instrument as claimed in claim 1, wherein the signal detecting component is a three-dimensional vector physical quantity detecting component configured to detect a three-dimensional vector physical quantity, and has at least three detecting axes linearly independent of each other.

14. The physical quantity measuring instrument as claimed in claim 13, wherein the signal detecting component has three detecting axes orthogonal to each other.

15. The physical quantity measuring instrument as claimed in claim 13, wherein the three-dimensional vector physical quantity detecting component has at least two detecting axes which are not orthogonal to each other in the three detecting axes which are linearly independent of each other.

16. The physical quantity measuring instrument as claimed in claim 13, wherein the signal detecting component has different detection sensitivity to three-dimensional components X, Y and Z of the desired three-dimensional vector physical quantity, and the signal processing component is able to correct the difference in the detection sensitivity by linearly combining the signals.

17. The physical quantity measuring instrument as claimed in claim 13, wherein the three-dimensional vector physical quantity detecting component comprises acceleration sensors.

18. The physical quantity measuring instrument as claimed in claim 13, wherein the three-dimensional vector physical quantity detecting component comprises magnetic sensors.

19. The physical quantity measuring instrument as claimed in claim 18, wherein the magnetic sensors have a magnetic concentrator.

20. The physical quantity measuring instrument as claimed in claim 13, wherein the signal processing component comprises:

a sign control component configured to invert, with respect to required components, signs of individual signals from the three-dimensional vector physical quantity detecting component;

a signal switching component configured to switch between inverted signals from the sign control component and non-inverted signals from the three-dimensional vector physical quantity detecting component; and an adding component configured to add the inverted signals and the non-inverted signals from the signal switching component.

21. The physical quantity measuring instrument as claimed in claim 20, wherein the signal detecting component further comprises:

a second sign control component configured to invert, with respect to the required components, the signs of the individual signals; and a second signal switching component configured to switch between inverted signals and non-inverted signals from the second sign control component.

22. The physical quantity measuring instrument as claimed in claim 21, wherein the second sign control component is able to invert sign relationships with respect to offset components included in the signals the signal detecting component detects and with respect to signals other than the offset components in the signals the signal detecting component detects.

23. A signal processing method in a physical quantity measuring instrument for detecting signals based on a desired physical quantity and for calculating the physical quantity by executing signal processing, the signal processing method comprising:

a signal detecting step of detecting a plurality of signals based on the physical quantity by a signal detecting component;

a signal processing step of linearly combining the signals detected at the signal detecting step with coefficients varying with time in a manner that all the signal components based on the desired physical quantity are included; and an arithmetic processing step of calculating the physical quantity from signal data output at the signal processing step.

24. The signal processing method in the physical quantity measuring instrument as claimed in claim 23, wherein the desired physical quantity is three-dimensional components X, Y and Z of the three-dimensional vector physical quantity;

the signal detecting step is a three-dimensional vector physical quantity detecting step of detecting a signal Hx based on the X component, a signal Hy based on the Y component and a signal Hz based on the Z component; and the linear combinations of the signal processing step outputs are combinations that satisfy (Hx+Hy+Hz), (Hx+Hy−Hz), (Hx−Hy+Hz) and (−Hx+Hy+Hz).

25. The signal processing method in the physical quantity measuring instrument as claimed in claim 23, wherein the desired physical quantity is three-dimensional components X, Y and Z of the three-dimensional vector physical quantity;

the signal detecting step is a three-dimensional vector physical quantity detecting step of detecting a sum A of a signal Hx based on the X component and a signal Hz based on the Z component, a difference B between the signals Hx and Hz, a sum C of a signal Hy based on the Y component and the signal Hz, and difference D between the signals Hy and Hz, wherein A=Hx+Hz, B=−Hx+Hz, C=Hy+Hz, and D=−Hy+Hz; and the linear combinations the signal processing step outputs consist of that satisfy (A+C), (A+D), (B+D) and (B+C).

26. The signal processing method in the physical quantity measuring instrument as claimed in claim 23, wherein the linear combinations the signal processing step outputs consist of combinations that satisfy (A+C), (−A−D), (B+D), and (−B−C).

27. The signal processing method in the physical quantity measuring instrument as claimed in claim 23, wherein the linear combinations the signal processing step outputs consist of combinations that satisfy (−A−C), (A+D), (−B−D) and (B+C).

28. The signal processing method in the physical quantity measuring instrument as claimed in claim 23, wherein the linear combinations the signal processing step outputs consist of combinations that satisfy (A+C), (A+D), (B+D), (B+C), (−A−C), (−A−D), (−B−D), and (−B−C).

29. The signal processing method in the physical quantity measuring instrument as claimed in claim 23, wherein
the signal detecting step is a three-dimensional vector physical quantity detecting step of detecting a three-dimensional vector physical quantity, and detects signals with the signal detecting component having at least three detecting axes linearly independent of each other.

30. The signal processing method in the physical quantity measuring instrument as claimed in claim 29, wherein
the signal detecting step detects the signals with the signal detecting component having three detecting axes orthogonal to each other.

31. The signal processing method in the physical quantity measuring instrument as claimed in claim 29, wherein the three-dimensional vector physical quantity detecting step detects the signals with a three-dimensional vector physical quantity detecting component having three detecting axes which are linearly independent of each other and at least two of them are not orthogonal to each other.

32. The signal processing method in the physical quantity measuring instrument as claimed in claim 29, wherein the signal processing step comprises:
a sign control step of inverting, with respect to required components, signs of individual signals from the three-dimensional vector physical quantity detecting step;
a signal switching step of switching between inverted signals from the sign control step and non-inverted signals from the three-dimensional vector physical quantity detecting step; and
an adding step of adding the inverted signals and the non-inverted signals from the signal switching step.

33. The signal processing method in the physical quantity measuring instrument as claimed in claim 32, wherein the signal detecting step further comprises:
a second sign control step of inverting, with respect to the required components, the signs of the individual signals; and
a second signal switching step of switching between inverted signals and non-inverted signals from the second sign control step.

34. The signal processing method in the physical quantity measuring instrument as claimed in claim 33, wherein the second sign control step is able to invert sign relationships with respect to offset components included in the signals the signal detecting step detects and with respect to signals obtained by eliminating the offset components from the signals the signal detecting step detects.

* * * * *